United States Patent [19]

Nishizawa et al.

[11] Patent Number: 4,534,033
[45] Date of Patent: Aug. 6, 1985

[54] THREE TERMINAL SEMICONDUCTOR LASER

[75] Inventors: Jun-ichi Nishizawa; Tadahiro Ohmi; Masakazu Morishita, all of Miyagi, Japan

[73] Assignee: Handotal Kenkyu Shinkokai, Japan

[21] Appl. No.: 411,080

[22] Filed: Aug. 24, 1982

[30] Foreign Application Priority Data

Aug. 25, 1981 [JP] Japan ................................ 56-133106
Jun. 26, 1982 [JP] Japan ................................ 57-110264

[51] Int. Cl.³ .............................................. H01S 3/19
[52] U.S. Cl. ...................................... 372/50; 357/17; 357/22; 357/41; 372/46
[58] Field of Search ............... 372/46, 50, 26; 357/17, 357/41, 22 R, 22 V, 22, 38

[56] References Cited

U.S. PATENT DOCUMENTS 4,408,330  10/1983  An et al. ................................ 372/50
4,430,741  2/1984   Fukuzawa et al. ................... 372/50

OTHER PUBLICATIONS

"Bipolar Mode Static Induction Transistor (BSIT) High Speed Switching Device", J. Nishizawa, T. Ohmi, Y. Mochida, T. Matsuyama and S. Iida–International Electron Device Meeting (IEDM), 1978 Dec. 4–6, Washington, D.C., pp. 676–679.

"Punching Through Device and Its Integration Static Induction Transistor", Tadahiro Ohmi–IEEE Transaction on Electron Device, vol. ED-27, No. 3, Mar. 1980, pp. 536–545.

*Primary Examiner*—James W. Davie
*Attorney, Agent, or Firm*—Sughrue, Mion, Zinn, Macpeak, and Seas

[57] ABSTRACT

A semiconductor laser includes an anode region of a first conductivity type made of a highly doped region, an active layer adjacent the anode region, a channel region made of a high-resistivity region and adjacent the active layer, a cathode region of a second conductivity type at one end of the channel region which is made of a highly doped region, and a gate region that surrounds at least part of said channel region and which is made of a highly doped region of the first conductivity type. The anode region and channel region have a wider band gap than that of the active layer.

23 Claims, 50 Drawing Figures

S = 6μm

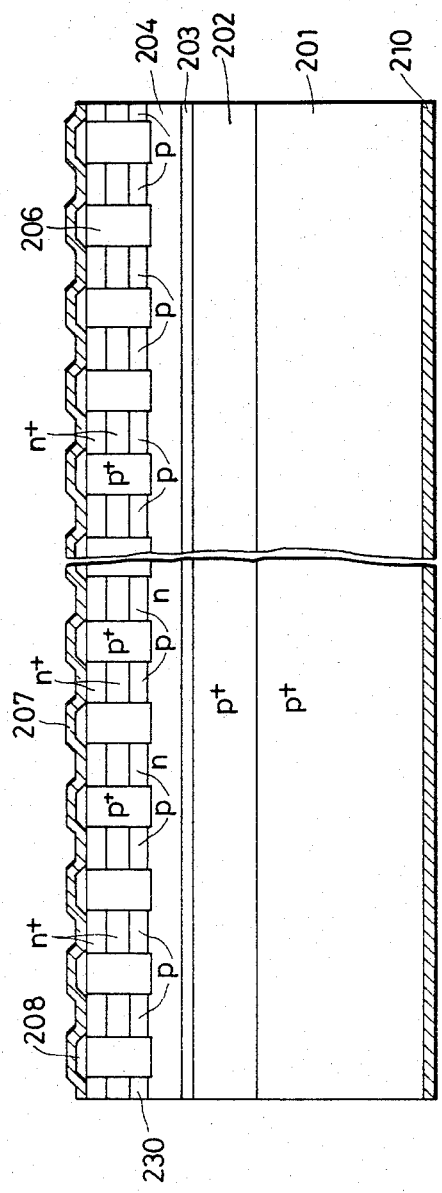

4,534,033

THREE TERMINAL SEMICONDUCTOR LASER

BACKGROUND OF THE INVENTION

The present invention relates to a three-terminal double heterojunction injection laser, and more particularly to a semiconductor laser integral with a bipolar mode static induction transistor having high control efficiency.

Semiconductor lasers are small in size, produce a laser beam with high efficiency and are capable of direct modulation, and so have potential use as light sources for optical communications, optical information processing systems and optical ICs. Conventional double heterojunction injection lasers require a only small threshold current density and use a stripe geometry structure to stabilize the lasing mode. But each of them is electrically a diode and requires an external transistor for effecting direct modulation. If the stripe width is made very small, the threshold current density is extremely increased and laser oscillation is effected in many axial modes rather than in a single mode. The size of the semiconductor laser is critical in optical ICs and a reduction in the stripe width is unavoidable.

SUMMARY OF THE INVENTION

Therefore, one object of the present invention is to provide a three-terminal semiconductor that is formed integrally with an static induction transistor for controlling carrier injection into the active layer of the laser so as to achieve efficient and high-speed control of the laser output.

Another object of the invention is to provide a three-terminal semiconductor laser that has a very small stripe width but which produces an optical output in a single transverse mode, has a low threshold exciting current density and is capable of using a control electrode of small power consumption.

BRIEF DESCRIPTION OF THE DRAWINGS

FIGS. 35a and 35b shows an electrostatic induction semiconductor laser having a p-region in the channel and a structure for stabilizing the transverse and axial modes, wherein FIG. 35(a) is a cross section cut in a direction perpendicular to the stripe and FIG. 35(b) is a longitudinal section cut along the center of the stripe.

DETAILED DESCRIPTION OF THE PREFERRED EMBODIMENTS

Figure 1:
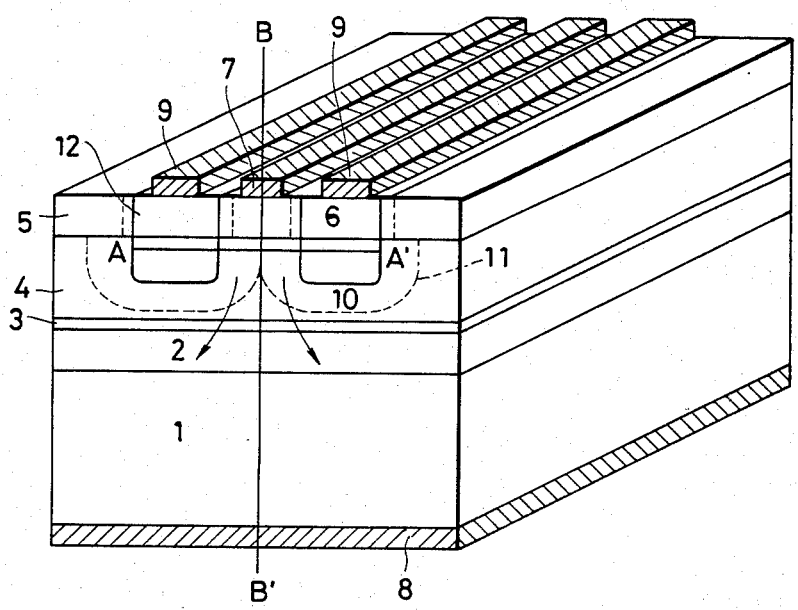
FIG. 1 is a perspective view of a static induction semiconductor laser according to one embodiment of the present invention.

FIG. 1 is a perspective view of a semiconductor laser according to the present invention, which is formed integrally with a bipolar mode static induction transistor (hereunder referred to as a BSIT). The transistor is made of GaAs and $Ga_{1-x}Al_xAs$; it comprises a $p^+$—GalAs substrate 1 having successively formed thereon a $p^+$—GaAlAs layer 2, an active $n^-$—GaAs layer 3, a $n^-$—GaA As layer 4 and a $n^+$—GaAs layer 5. The transistor also has two $p^+$—regions 6 surrounded by the solid line 12, and electrodes 7, 8 and 9, which are a cathode, an anode and a gate, respectively.

FIG. 1 also shows two depletion regions 10 surrounded by the dashed line 11. As shown in FIG. 1, at zero gate voltage, the depletion layer 10 extending from the $p^+$—gate region on one side is in complete contact with the depletion layer 10 extending from the $p^+$—gate region on the other side in the channel region, i.e., the transistor is so designed that the channel is "pinched off" with zero gate bias. In other words, the transistor is a normally-off static induction transistor wherein no current flows with zero gate bias. If the channel is not pinched off and the two depletion layers 10 are not in mutual contact even with zero gate bias; and if only the width of the current channel is changed, the resulting device is a normally-on static induction transistor wherein a current flows even with zero gate bias, causing unnecessary power consumption. Of course, such a normally-on transistor may be used if high-speed modulation is effected by maintaining the supply of a bias current smaller than the threshold level.

Figure 2:
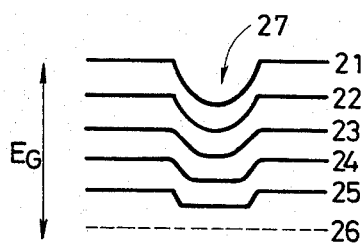
FIG. 2 is a potential distribution diagram for a cross section of FIG. 1 as taken on the line A—A'.

FIG. 2 shows the potential distribution of the gate and channel in FIG. 1 as cut along the line A—A'. When the channel is completely pinched off with zero gate bias and if the gate made of $Ga_{0.7}Al_{0.3}As$ is supplied with positive voltages of 0.4 V, 0.8 V, 1.2 V and 1.6 V, the potential distribution of the channel varies as indicated by lines 22, 23, 24 and 25. The dashed line 26 indicates the cathode potential. As the forward gate voltage is increased, the potential barrier in the channel is decreased gradually, and electrons in the cathode region 5 are injected into the channel to cause a current flow. Since the p+—gate is highly biased in the forward direction, holes are injected into the channel from the gate so that an almost equal number of electrons and holes are present in the channel.

Figure 3A:
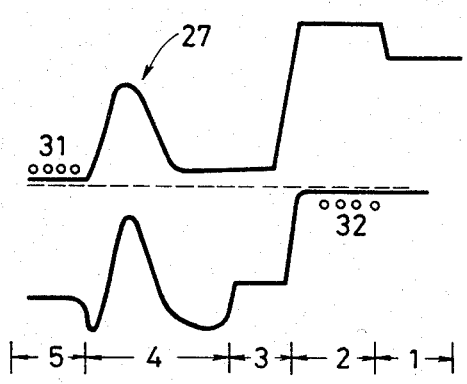
FIGS. 3a, 3b and 3c are potential distribution diagrams for a cross section of FIG. 1 as taken on the line B—B'.
Figure 3B:
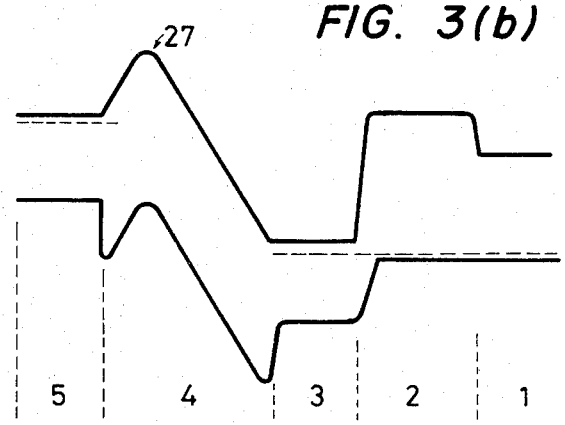
Figure 3C:
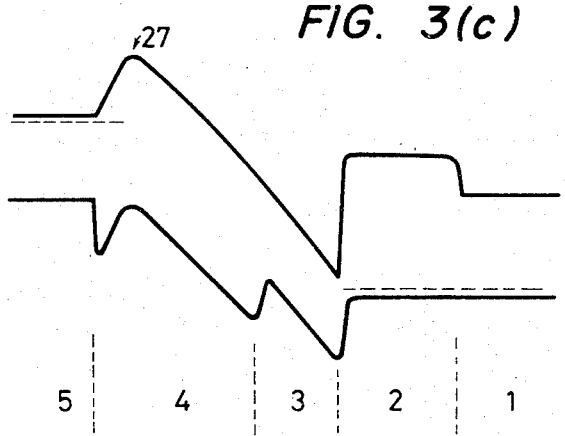

FIGS. 3 are potential diagrams of FIG. 1 as taken in the direction of B—B' at zero gate voltage. Regions 1 to 5 indicate the corresponding regions in FIG. 1, and the potential is plotted on the y-axis. In FIG. 3, region 27 is the potential barrier generated in the channel by the p+n diffusion potential and prevents the passage of carriers (electrons) 31. In FIG. 3, holes are indicated at 32. The gate voltage changes the height of the barrier are shown in FIG. 2, and electrons are injected into the n−—channel region 4 from the cathodic n+—region 5 so as to change the amount of electron injection into the active layer 3. FIG. 3(a) shows the potential distribution when the voltage between the cathode and anode is zero. FIGS. 3(b) and (c) show the potential distribution between cathode and anode when the anode is supplied with a positive voltage. FIG. 3(b) assumes the case where the depletion layer extending from the p+—gate almost reaches the active layer, and FIG. 3(c) assumes the case where the active layer is also a substantial depletion layer. The device having the structure of FIG. 1 is electronically an n-channel static induction thyristor although the presence of a heterojunction makes this point rather unobvious. Seen in the direction of B—B' in FIG. 1, the device is a n+np+ diode. No current will flow through this device even if it is supplied with a forward voltage, as explained by the following mechanism. Electron injection from the n+ cathode region 5 is inhibited by the potential barrier 27 generated in the channel by the p+ gate whereas the hole injection from the p+ anode region 2 is inhibited by the p+n diffusion potential. Only when the active layer 3 has become a complete depletion layer as shown in FIG. 3(c) is the potential barrier due to the p+n diffusion potential on the front end of the anode lowered with the result that holes are injected into the active layer from the p+ anode region to cause a current flow. Needless to say, with a device having a heterojunction, the resulting current is much smaller than in a device having a homojunction even if the active layer has completely become a depletion layer. In any event, to make a normally-off device wherein no current flows at zero gate voltage even if a certain positive voltage is applied to the anode, it is essential that the n− channel have an adequately high potential barrier formed by the diffusion potential between the p+ gate and the channel.

Suppose the intergate gap is 2a (cm), the impurity density of the n-region 4 in the channel surrounded by the gates is $N_D$ (cm$^{-3}$) and the channel length determined by the depth of each p+ gate in the vertical direction is L (cm). In order to provide complete contact between the depletion layers extending from the p+ gate regions so that the channel is completely pinched off to produce a potential barrier, the following relation must be at least satisfied: $N_D (2a)^2 < 4.5 \times 10^7$ (cm$^{-3}$). If 2a is 1 μm, this relation may be written as $N_D < 4.5 \times 10^{15}$ cm$^{-3}$, and if 2a is 2 μm, the relation may be $N_D < 1.1 \times 10^{15}$ cm$^{-3}$. To provide a potential barrier in the carrier in spite of a certain voltage applied to the anode, the channel length L must be adequately greater than 2a. Unless L/2a is greater than 0.7, no potential barrier will exist in the channel against a voltage of 1 to 2 volts applied to the anode. To provide better normally-off characteristics, L/2a is preferably 1.0 or more. Therefore, to provide a normally-off device, the relation $N_D (2a)^2 < 4.5 \times 10^7$ (cm$^{-3}$), preferably $N_D (2a)^2 < 2 \times 10^7$ (cm$^{-3}$); and the relation L/2a > 0.7, preferably L/2a > 1.0 must be satisfied at the same time. This double relation means that, in order to keep the height of the potential barrier in the channel constant, the value of L/2a can become smaller as the value of $N_D (2a)^2$ becomes smaller. Generally, to provide good normally-off characteristics, $N_D$ or the impurity density of the n− GaAlAs layer 4 is selected at a value of the order of $10^{14}$ cm$^{-3}$ or $10^{13}$ cm$^{-3}$. Even if the impurity density of the channel is that low, the density of electrons injected into the channel from the cathode exceeds $1 \times 10^{17}$ cm$^{-3}$ if the p+ gate is deeply biased in the forward direction. The electrons injected from the cathode flow into the active layer 3 as shown in FIG. 3(b) for example. Because of the potential barrier, the electrons flowing into the active layer 3 are unable to migrate into the p+ region 2 and build up in that layer. Therefore, the active layer 3 becomes negatively charged. As the active layer 3 is negatively charged, the junction between the p+ region 2 and n− region 3 is biased in the forward direction, namely, holes are injected into the active layer 3 from the p+ region 2. Because of the potential barrier between the regions 3 and 4, few of the holes migrate into the n− region 4. Therefore, both electrons and holes are accumulated in the active layer 3. If the density of electrons and holes reaches a certain level, laser oscillation takes place. Therefore, the device of FIG. 1 is electronically a static induction thyristor and laser oscillation takes place in the active layer 3 that is contiguous to the anode of the thyristor and which has a narrow inhibition band.

The current can be turned off and the laser oscillation stopped by returning the forward bias on the p+ gate to zero. The turn-off period can be further reduced by applying a few volts of reverse voltage to the gate. As already mentioned, the device of FIG. 1 is basically a static induction thyristor, but almost all of the holes that have been injected from the anode stay in the active layer and will not reach the p+ gate. In this sense, the device functions as an intermediate between a BSIT and an electrostatic induction thyristor, and the turn-off period may be regarded as a stage where the holes that have been injected into the channel from the p+ gates are again drawn into the p+ gates. The turn-off period is very short if the channel width is small.

The device of FIG. 1 has the following specifications: the p+ substrate 1 has an impurity density of 1 to $2 \times 10^{19}$ cm$^{-3}$; the p+Ga$_{1-x}$Al$_x$As layer 2 has a thickness of 1 to 5 μm and an impurity density of $1 \times 10^{18}$ to $1 \times 10^{19}$ cm$^{-3}$; the GaAs active layer has a thickness of 0.05 to 1 μm and an impurity density of $1 \times 10^{14}$ to $1 \times 10^{17}$ cm$^{-1}$; the n− Ga$_{1-x}$—Al$_x$As layer 4 has a thickness of 0.5 to 3 μm and an impurity density of $1 \times 10^{13}$ to $1 \times 10^{15}$ cm$^{-3}$; the n+ GaAs layer has an impurity density of $1 \times 10^{18}$ to $1 \times 10^{19}$ cm$^{-3}$; and the p+ gate region 6 has an impurity density of $1 \times 10^{17}$ to $5 \times 10^{19}$ cm$^{-3}$. The higher the impurity density of the n+ cathode region and p+ gate region, the better. The intergate gap (channel width) is 0.3 to 3 μm.

In FIG. 1, the n+ cathode region is formed only in the GaAs layer 5, but may extend to the GaAlAs layer 4. To increase the current gain of the device as determined by the ratio of anode current to gate current, it is preferred that an insulating region be formed between the cathode region and gate region. The more holes injected from the p+ gate to the n-channel region with a forward bias to the gate, the more electrons injected from the n+ cathode, so the channel width is preferably shorter than twice the hole diffusion length. Alternatively, the channel width may be increased to permit some current to flow even with zero gate bias, and in this case, some reverse bias must be applied to the gate to inhibit the current flow.

As well known, the semiconductor laser will not emit light the moment a current is caused to flow. No light is emitted unless the carrier density of the active layer exceeds a threshold value. When the threshold current density, unit charge, thickness of the active layer and the lifetime of carriers in the active layer (which is determined by, say, spontaneous emission) are written by Jth, q, d and $\tau$, respectively, the threshold carrier density is represented by $\tau Jth/qd$. Therefore, to obtain laser light emission that responds most faithfully to the voltage signal applied to the gate, a current close to the threshold current must always be flowing in the device. Alternatively, a normally-on device may be used wherein a current close to Jth flows even with zero gate bias. Or, a normally-off device may be used wherein some forward bias is applied to the gate to cause a current flow close to Jth.

Figure 4:
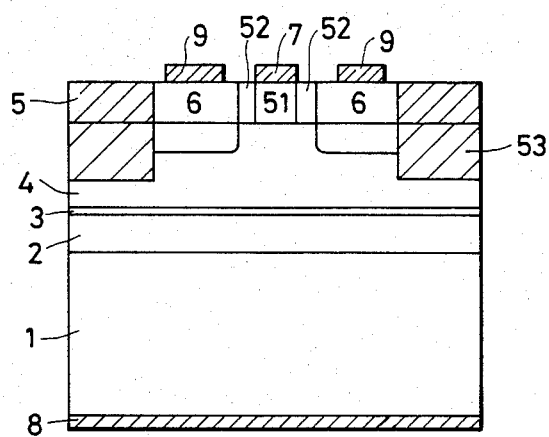
FIGS. 4 to 9 are cross sections of other embodiments of the electrostatic semiconductor laser of the present invention.
Figure 5:
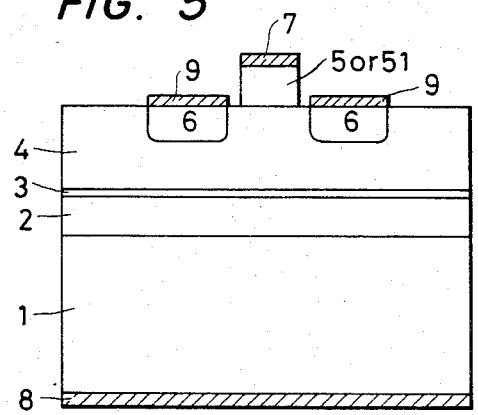
Figure 6:
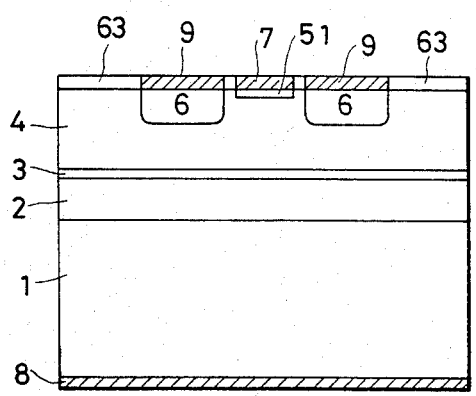

The device shown in FIG. 1 can be fabricated by forming layers 2, 3, 4 and 5 successively on the p+ GaAs substrate by the epitaxial growth technique, forming a p+ gate region by ion implantation of Be to a concentration of 1 to $5 \times 10^{19}$ cm$^{-3}$, and annealing the assembly in an AsH$_3$ atmosphere at about 1 to 3 Torr and at 800°–900° C. In FIG. 1, the layer 5 is made of GaAs, the layer 4 is made of say Ga$_{0.7}$Al$_{0.3}$As and the region 6 is a p+ region, so when the gate voltage becomes close to the GaAs diffusion potential, a forward current flows between the p+ GaAs and the n+ GaAs in the layer 5 rather than in the Ga$_{0.7}$Al$_{0.3}$As channel to thereby reduce the current gain defined by the ratio of anode current to gate current. To prevent this, an insulation region 52 made of Si$_3$N$_4$, AlN, Al$_2$O$_3$ or SiO$_2$ is formed between each gate region 6 and the cathode region 51 beneath the cathode electrode 7 as shown in FIG. 4. By so doing, no carrier injection from the gate region 6 to the cathode region 51 will take place and an increased current gain is obtained. If an insulation region 53 is also formed on either side of the gate region, the gate capacitance is decreased to increase the modulation frequency and current gain at the same time. It is preferred that the cathodic n+ region 51 extend to the GaAlAs layer 4. Carrier injection from the gate region into the cathode region can also be prevented by removing part of the layer 5 as shown in FIG. 5 to separate the cathode from the gate, or by eliminating the layer 4 entirely as shown in FIG. 6. The region 51 is an n+ region. For reducing the contact resistance of the electrodes, it is also preferred that the GaAlAs region be in continuous contact with the GaAs region. In a GaAs-GaAlAs double heterojunction semiconductor laser, the layer 5 functions only to reduce the ohmic resistance and it is not essential to the laser mechanism per se. An InP-InGaPAs double heterojunction semiconductor laser is basically a three-layer structure comprising InP, InGaPAs and InP layers as shown in FIG. 6.

Figure 7:
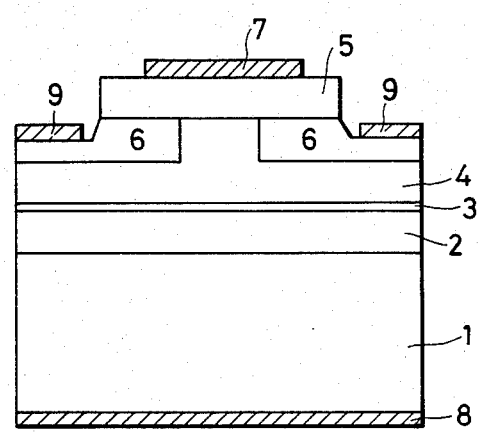
Figure 8:
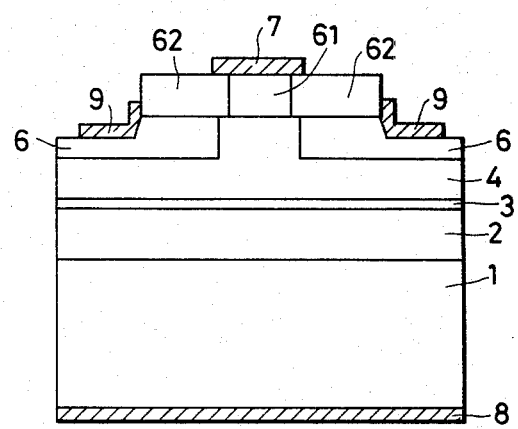

In the embodiments illustrated above, the gate region is formed on top of the device, but it may be of the buried type as shown in FIG. 7. With the buried gate, holes are also injected from the gate 6 into the cathode region, so if a greater current gain is desired, a semiinsulation region 62 may be formed on either side of the layer 5 contiguous with the p+ gate region 6, as shown in FIG. 8, with an n+ region being formed only in a region 61 into which electrons are injected. A complete buried gate is formed by making the layer 5 with GaAlAs, which is the same material as used in the layer 4. Needless to say, an improved current gain can be achieved by forming an n+ cathode region that extends to the layer 4.

Figure 9:
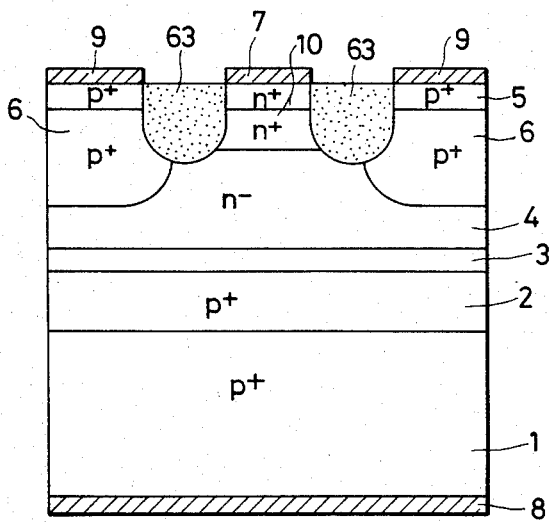

FIG. 9 shows another embodiment of the semiconductor laser of the present invention. It has a region 63 which is an insulation layer made of Si$_3$N$_4$, AlN, Al$_2$O$_3$ or SiO$_2$. The insulation layer is formed between each gate and cathode, and a GaAs layer 5 is formed with an n+ region that extends to the GaAlAs layer. The insulation layer inhibits hole injection from the gate into the cathode. Since the GaAlAs n+ region of the cathode and GaAlAs p+ region of the gate are thicker than the hole and electron diffusion length, no carrier injection into either GaAs region takes place and an increased current gain is obtained. In short, the device of FIG. 9 is designed so that the electrode region is made of GaAs with a small band gap to reduce the ohmic contact without reducing the current gain.

Figure 10:
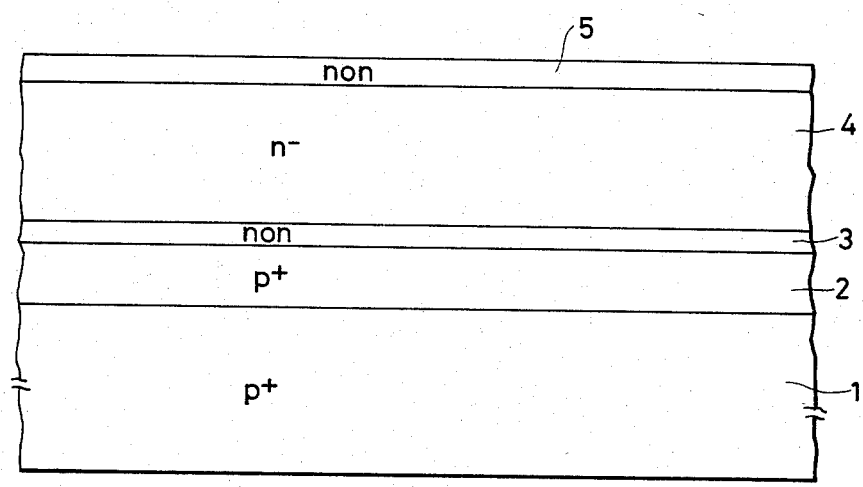
FIG. 10 is a diagram showing how the laser of FIG. 9 is fabricated.

This device is fabricated by the sequence shown in FIG. 10: on a p+ GaAs substrate 1, p+ GaAlAs layer 2, a non-doped GaAs layer 3, n− GaAlAs layer 4 and a non-doped GaAs layer are successively formed by a crystal growth technique; then a stripe of n+ and p+ regions is formed by diffusion, ion implantation or other suitable methods; then a striped interfacial region is etched between the cathode and gate regions; and an insulation layer is formed. The insulation layer can be formed at low temperatures from SiO$_2$, Si$_3$N$_4$, AlN or Al$_2$O$_3$ by plasma- or photoexcited CVD, or it may be formed of a polysilicon layer deposited on a thin Si$_3$N$_4$ film by plasma- or photoexcited CVD. The p+ region is formed by implanting elements such as Be and Cd, and the n+ region is formed by implanting elements such as S and Se.

For shortening the channel length and improving the normally-off characteristics of the device shown in FIG. 1 and FIGS. 4 to 9, it is effective to form a thin p-layer of a relatively low impurity density between the n+ cathode region and the active layer. As already described, if the channel region is made of only an n-region, the ratio of the channel length (L) to the intergate gap (2a) must be greater than 0.7; otherwise, no potential barrier is formed in the channel upon the application of a voltage of 1 to 2 volts to the anode. This demerit can be eliminated by forming a p-region in the channel. In the presence of a p-region, the potential barrier is not lost even if the value of L/2a is less than 0.7, and this helps shorten the channel length.

Figure 11:
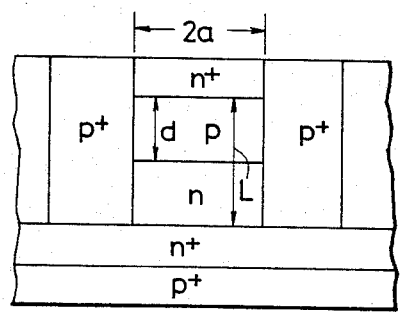
FIG. 11 is a diagram of a model having a p-region in the channel.
Figure 12:
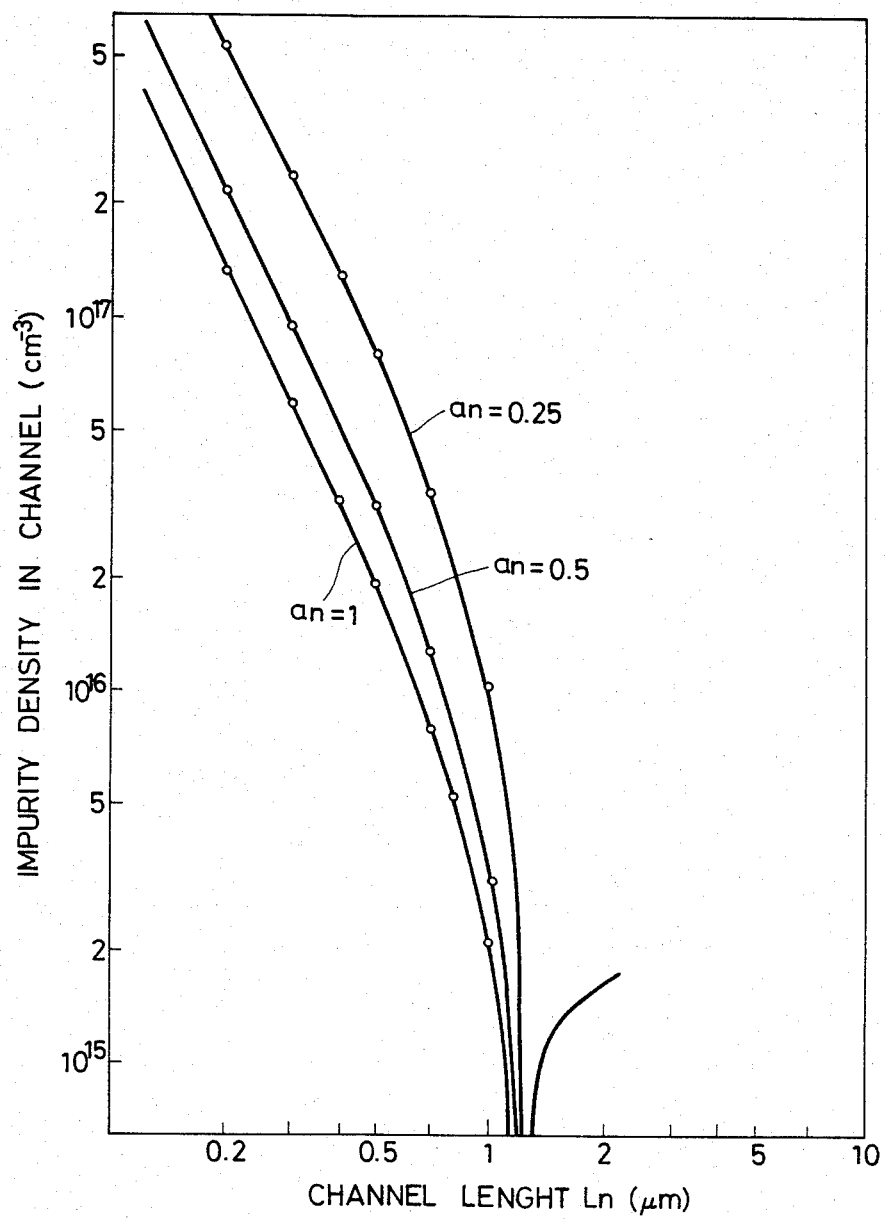
FIG. 12 is a graph showing the effect of the p-region.

A three-terminal laser with a p-region is described more specifically by reference to the model diagram of FIG. 11, wherein the intergate gap, the channel length and the thickness of the p-region are indicated by 2a, L and d, respectively. FIG. 12 shows the requirements for producing a potential barrier of 0.6 volts in the channel when a forward bias of 1.5 volts is applied between anode and cathode with zero gate bias on the condition that the n+ and p+ regions have impurity densities of $5 \times 10^{18}$ cm$^{-3}$ and $3 \times 10^{19}$ cm$^{-3}$, respectively, the n-region has an impurity density of $1.3 \times 10^{14}$ cm$^{-3}$, and 2a is 1 μm. In FIG. 12, the channel length L is plotted on the x-axis and the carrier concentration of the p-region is plotted on the y-axis. As the parameter, the ratio of the thickness (d) of the p-region to the channel length (L) is used and wirtten as $a_n$ (=(d/L)). If $a_n$ is 1, all of the channel is made of the p-region, and the smaller the value of $a_n$, the thinner the p-region. If L is 0.8 m and $a_n$ is 0.25, the potential barrier can be held at 0.6 volts by using a carrier concentration $2.3 \times 10^{16}$ cm$^{-3}$ in the p-region. Obviously, the channel length can be reduced remarkably by increasing the carrier concentration.

Figure 13:
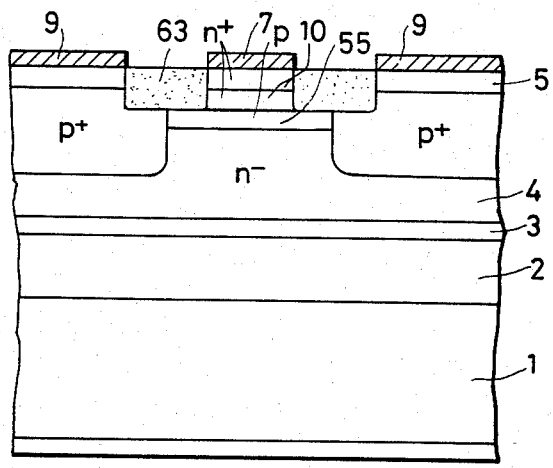
FIG. 13 is a schematic representation of a static induction semiconductor laser having a p-region in the channel.

FIG. 13 shows an embodiment of the device wherein a p-region 55 is formed in the channel.

The p-region 55 is electrically connected to the gate region 5 of p+-.

To stabilize the mode of laser oscillation, the refractive index of the light guiding portion must be increased, but the device of FIG. 1 does not have a refractive index distribution in a direction parallel to the p-n junction. There are two methods of increasing the effective refractive index: one is to form a stripe having an area of high refractive index or great optical transmission loss that is formed by using a properly selected material and structure, and the other method is to provide a high optical gain region as a light guide path. The region of high optical gain can be formed by concentrating current injection in a certain area of the semiconductor to provide a population inversion of carrier in that area. The device shown in FIG. 1 is not so fabricated as to provide a refractive index distribution in the transverse direction. A stream of electrons injected from the cathode 7 is focused by the gate 6 but it spreads thereafter. The anode is usually formed on the entire bottom surface of the device and the substrate 1 is usually as thick as 100 μm, so the current applied spreads as indicated by the arrow in FIG. 1 and cannot be confined in the active layer 3 in the transverse direction. This causes an increase in the threshold current. Furthermore, such insufficient concentration of the current is detrimental to the stabilization of the transverse mode.

Figure 14:
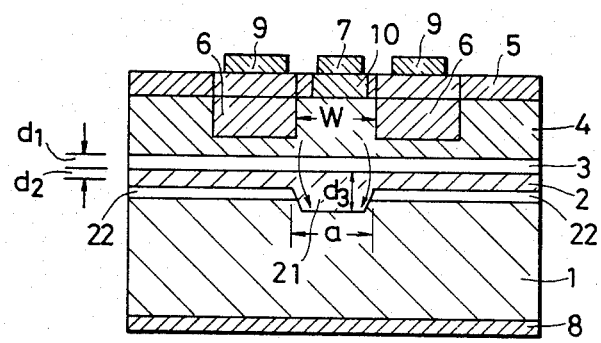
FIG. 14 is a cross section of a semiconductor laser having a transverse mode stabilizing structure.
Figure 15:
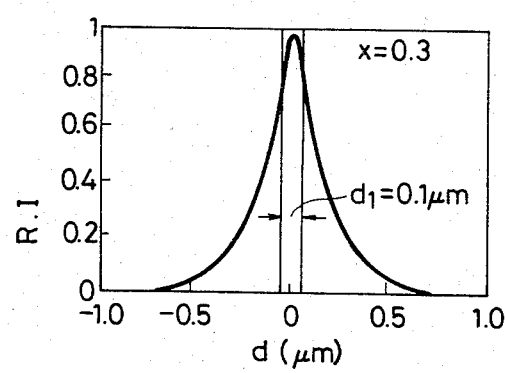
FIGS. 15 and 16a and b are plots showing the mode stabilizing effect.

The device of FIG. 14 has a dual structure to provide the interior with a practical difference in refractive index. The numerals 1 to 10 represent the same components as defined in FIG. 1; 21 represents a projection formed on the semiconductor layer 2, and 22 is a sixth semiconductor layer such as GaAs whose conductivity type is opposite that of the substrate and semiconductor layer 2 and which has a higher refractive index than the layer 2. One part of the dual structure is characterized by forming a thick region 21 in the area corresponding to the light emitting region (i.e. optical guided region). Therefore, the semiconductor layer 2 has a difference in thickness at the interface between the light emitting region and the other part of the layer, and it also changes the effective complex refractive index of the light that leaks out of the thin area of the semiconductor layer 2. FIG. 15 shows the intensity distribution of light in the direction perpendicular to the junction layers of the device comprising a GaAs active layer 0.1 μm thick sandwiched between $Ga_{0.7}Al_{0.3}As$ semiconductor layers. The x-axis indicates the distance in the vertical direction d (μm) and the y-axis indicates the relative intensity of light R.I. In this figure, the thickness of the active layer 3 is indicated by $d_1 = 0.1$ μm. It is obvious from FIG. 15 that a significant amount of light leaks out of the active layer. If the $Ga_{0.7}Al_{0.3}As$ layers do not have a thickness of at least about 0.6 μm, light leaks out to increase the loss of optical output. By reference to the laser device of FIG. 14, if the thickness ($d_2$) is smaller than 0.6 μm and the thickness of the region 21 is greater than 1 m, the optical loss in the area beyond the groove (width=a) is large and the optical loss within the groove is small so that the laser light is confined within the groove. The optical guided wave characteristics are determined by the difference in complex refractive index ($\tilde{\delta n}$) between the grooved area and the solid area, and $\tilde{\delta n}$ can be written as $$\Delta n + i \frac{1}{2Ko} \tilde{\alpha}$$

wherein $\Delta n$ is the effective refractive index, $\tilde{\alpha}$ is the effective absorption coefficient, and Ko is the wave number of laser lights in a vacuum. Since $\Delta n$ is substantially proportional to $\tilde{\alpha}$ and $\tilde{\alpha}$ is determined by the structure of the device, these parameters can be used to describe the optical guided wave characteristics. If $d_1 = 0.1$ μm and $d_2 = 0.6$ μm, $\tilde{\alpha} \cong 40$ cm$^{-1}$ and $\Delta n \cong 4 \times 10^{-4}$. If the value of $d_1$ is increased, less light leaks in the device as shown in FIG. 15, so if $d_1 = 0.15$ μm, $d_2$ is not greater than 0.5 μm ($\Delta n = 3 \times 10^{-4}$), and if $d_1 = 0.2$ μm, $d_2$ is not greater than 0.45 μm ($\Delta n \cong 2 \times 10^{-4}$). In these examples, the effective refractive index is rather small, and to make it equal to or larger than $1 \times 10^{-3}$, the following combinations of $d_1$ and $d_2$ and necessary: $d_1 = 0.1$ μm and $d_2 \leq 0.45$ μm ($\tilde{\alpha} \cong 200$ cm$^{-1}$), $d_1 = 0.15$ μm and $d_2 \leq 0.35$ μm ($\tilde{\alpha} = 300$ cm$^{-1}$), and $d_1 = 0.2$ μm and $d_2 \leq 0.25$ μm ($\tilde{\alpha} = 500$ cm$^{-1}$). But then, the loss indicated by $\tilde{\alpha}$ becomes very large.

The other part of the dual structure is to form a layer 22 in FIG. 14 whose conductivity type is opposite that of the substrate 1 and semiconductor layer 2 or a layer 22 of high resistivity and it has a higher refractive index than the layer 2. This arrangement provides another focusing of the current path on the substrate side of the semiconductor and confines the spread of current within the light emitting area of the laser. One manner of current flow is indicated by the arrow in FIG. 14; the current efficiency in the active layer of the semiconductor laser is remarkably improved and so is the confinement of the oscillation mode to further achieve a substantial reduction in the overall threshold current.

For a GaAs—$Ga_{1-x}Al_xAs$ double heterojunction laser, the relation between the density of electrons injected into the active layer and the gain of the optical wave guide ($\Delta g$) is represented by the following, based on the empirical formula for the threshold current:

$$\Delta g = \frac{e \eta \Gamma}{20 \tau s} n - 225 \text{ (cm}^{-1}) \quad (1)$$

wherein $e \cong 1.602 \times 10^{-9}$ coulomb, $\eta$: internal quantum efficiency, $\tau s$: carrier lifetime, $\Gamma$: light confinement coefficient, and n: carrier concentration (cm$^{-3}$). If $x = 0.3$, $d = 0.1$ μm, $\tau s = 1$ nsec, $n = 1$ and $\Gamma \cong 0.28$ (since $x = 0.3$ and $d = 0.1$ μm), $$\Delta g = 2.24 \times 10^{-16} n - 63 \text{ (cm}^{-1}) \quad (2)$$

The loss of optical output ($\alpha$ total) is represented by the following:

$$\alpha \text{ total} = \alpha i + \frac{1}{2L}\left(\ln\frac{1}{R_1} + \ln\frac{1}{R_2}\right) \quad (3)$$

wherein αi: scattering and absorption loss in the semiconductor, L: laser length, and $R_1$ and $R_2$: mirror reflection index. In the case discussed, a gain starts to be obtained when n is $2.8 \times 10^{17}$ cm$^{-3}$ and laser oscillation takes place when Δg is equal to α total. If αi = 10 cm$^{-1}$, L = 100 μm and $R_1 = R_2 = 0.31$ (GaAs), α total is 127 cm$^{-1}$ and laser oscillation takes place when nth is $8.5 \times 10^{17}$ cm$^{-3}$ (Jth = 1360 A/cm$^2$). In this case, the internal gain ($g_{net}$) is about 117 cm$^{-1}$.

Figure 16A:
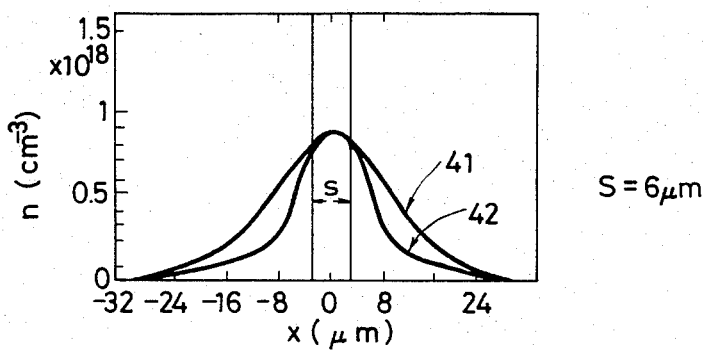
Figure 16B:
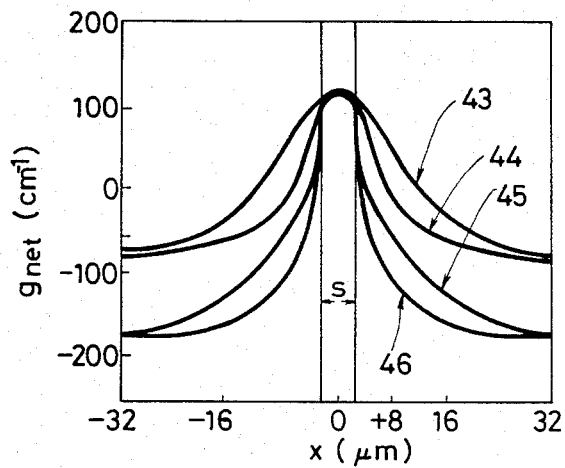

FIG. 16(a) shows the current spread in the transverse direction of the stripe, and FIG. 16(b) shows the net gain ($g_{net}$) distribution in the transverse direction of the stripe. In FIG. 16(a), the x-axis indicates the length (x in μm) in the transverse direction of the stripe, with the stripe center being indicated at 0, and the y-axis indicates the concentration of electrons injected (n in cm$^{-3}$). The stripe width (S) is assumed to be 6 μm. In FIG. 16(a), curve 41 indicates the current spread in the active layer of the semiconductor laser shown in FIG. 1, and curve 42 indicates the current spread observed in the device of FIG. 14 having a structure for focusing current on the substrate side. It is obvious that the device of FIG. 14 is very effective in focusing the current path and reducing the threshold current. For a semiconductor laser having a stripe width of 2 or 3 μm or less, the current spreads further and the threshold current density is extremely increased to cause more current to leak out of the stripe width, and the resulting loss occurring to the outside of the laser stripe causes local heat generation which in turn induces mode instability. Therefore, the narrower the stripe, the more important it is to provide a structure to prevent current spread. In FIG. 16(b), the x-axis indicates the length (x in μm) in the direction of the stripe width, with the stripe center being indicated at 0, and the y-axis indicates the net gain ($g_{net}$) free from the absorption and scattering loss in the semiconductor laser. In FIG. 16(b), curves 43 and 44 are the gains corresponding to the electron concentration distribution curves 41 and 42 in FIG. 16(a). Formula (2) is used in the calculation of the gain. Curves 45 and 46 show the deviations from curves 43 and 44 when the loss in the part other than the light guide path is about 100 cm$^{-1}$. It is apparent that the dual structure of the device shown in FIG. 14 faciliates a great increase in the light amplified gain to occur only within the stripe width, thereby further reducing the threshold exciting current and improving the stability in the transverse mode. The difference in complex refractive index in the transverse direction of the stripe width can be represented by the formula $$\delta\tilde{n} = \Delta n + i\frac{1}{2Ko}(\tilde{\alpha} - g)$$

in terms of the loss and gain defined above. The real part Δn and imaginary part $$\frac{1}{2Ko}(\tilde{\alpha} - g)$$

can be related to each other by the Kramers-Kroning relation, and Δn can be calculated if; $(\tilde{\alpha} - g)$ is known. The value of Δn is about $10^{-3}$ at maximum.

When the stripe width is decreased and the wavelength of the guided wave becomes a factor, the propagation gain is decreased or higher-order oscillation modes are produced unless the relation between the stripe width and the thickness of the active layer has a proper value. Table 1 lists the conditions for a rectangular dielectric waveguide to transmit only a single fundamental mode if the waveguide has a width W, a thickness d, an internal refractive index $n_1$ and a peripheral refractive index $n_2$. In table 1, λ indicates the free space wavelength, and each of the values there indicated represents the maximum for propagating only the fundamental mode.

TABLE 1

|   | $\frac{n_1}{n_2} = 1.001$ | $\frac{n_1}{n_2} = 1.01$ | $\frac{n_1}{n_2} = 1.05$ | $\frac{n_1}{n_2} = 1.5$ |
|---|---|---|---|---|
| W = d | $15.3\frac{\lambda}{n_1}$ | $4.9\frac{\lambda}{n_1}$ | $2.25\frac{\lambda}{n_1}$ | $0.92\frac{\lambda}{n_1}$ |
| W = 2d | $19\frac{\lambda}{n_1}$ | $6.1\frac{\lambda}{n_1}$ | $2.8\frac{\lambda}{n_1}$ | $1.21\frac{\lambda}{n_1}$ |
| W = 4d | $26.8\frac{\lambda}{n_1}$ | $8.5\frac{\lambda}{n_1}$ | $3.8\frac{\lambda}{n_1}$ | $1.37\frac{\lambda}{n_1}$ |

If these values are exceeded, higher-order modes are propagated, but on the other hand, if the actual dimensions are smaller than these values, more propagation loss occurs. This relation is illustrated in Table 2 for a GaAs—GaAlAl laser ($n_1 = 3.6$) and an InP—InGaPAs laser ($n_1 = 3.3$) each of which usually has $n_1/n_2$ of 1.05.

TABLE 2

|   |   | W = d | W = 2d | W = 4d |
|---|---|---|---|---|
| GaAs—GaAlAs Laser | W (μm) | 0.53 | 0.66 | 0.90 |
| λ = 0.85 μm | d (μm) | 0.53 | 0.33 | 0.22 |
| InP—InGaPAs Laser | W (μm) | 1.0 | 1.27 | 1.73 |
| λ = 1.5 μm | d (μm) | 1.0 | 0.64 | 0.43 |

If the stripe width W is about 1 μm, the propagation loss can be minimized by using an active layer whose thickness is close to the value indicated by d in Table 2. In addition, the InP—InGaPAs laser requires greater dimensions than the GaAs—GaAlAs laser and hence is more difficult to adapt to the use of a narrower stripe. For most semiconductor lasers, the exterior of the stripe width has a ratio $n_1/n_2$ of about 1.001 and the active layer can be made thinner than seems possible in view of the limitations noted in Table 2. However, the data in Table 2 applies without modification to a buried heterojunction DH semiconductor laser (BH laser). Further discussion will be made on the reduction of the stripe width hereafter.

Figure 17:
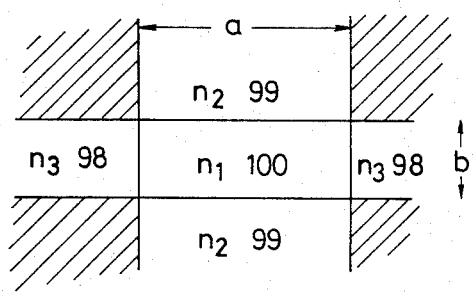
FIG. 17 is a diagram of a light guide path model.
Figure 18:
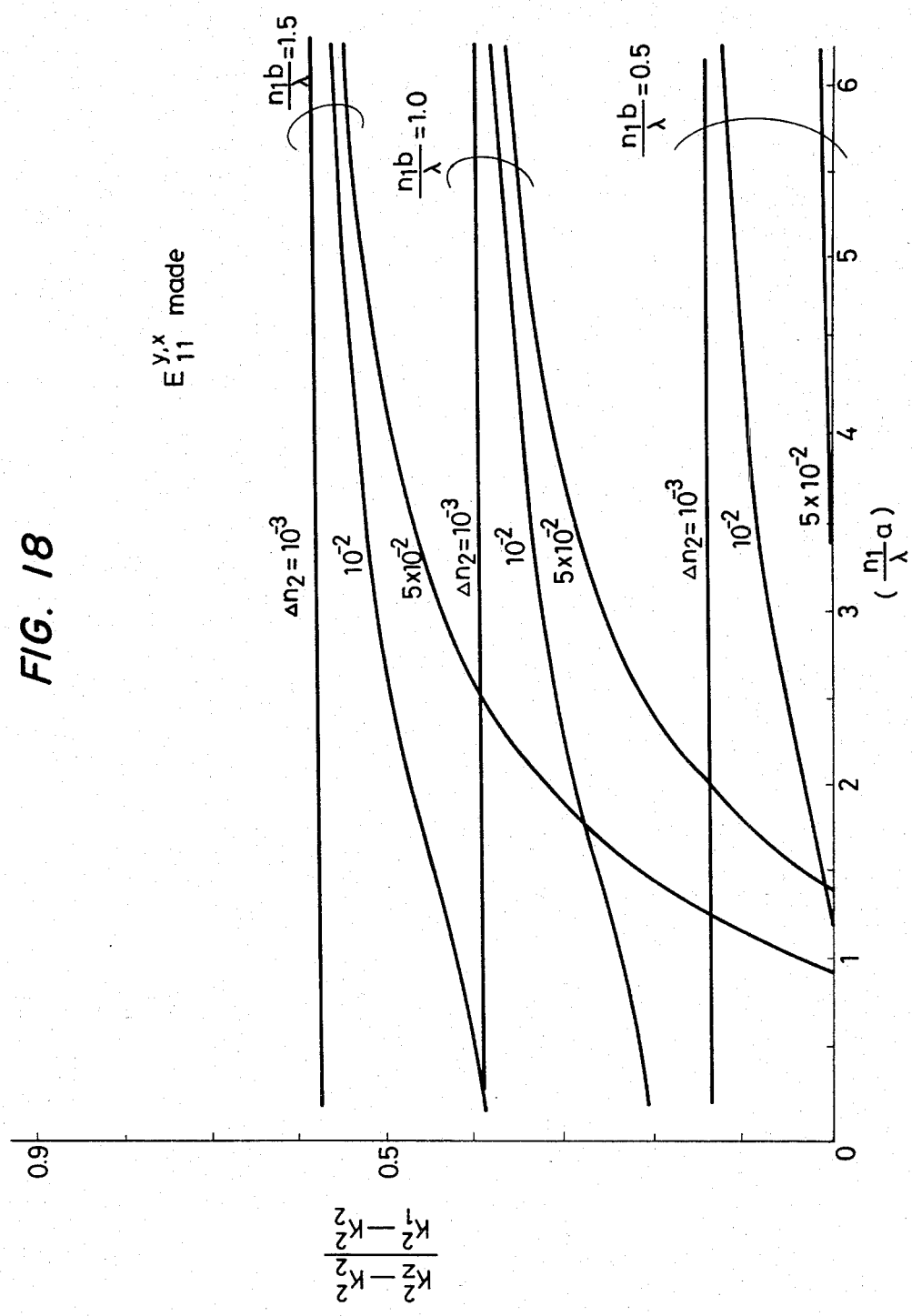
FIGS. 18 and 19 graphically show the light guide characteristics.

FIG. 17 is a cross section of an optical wave guide model, wherein a lightguide region 100 is surrounded by regions 98 and 99. The region 100 has a refractive index $n_1$, region 99 has a refractive index $n_2$, and region 98 has a refractive index $n_3$, with $n_1$ being greater than $n_2$ and $n_3$. Region 100 corresponds to the active region of a semiconductor laser, the lightguide width a corresponds to the stripe width, and the lightguide thickness b corresponding to the thickness of the active layer. The hatched areas are neglected on the assumption that no light passes there. FIG. 18 shows the dispersion characteristics of the optical wave guide of FIG. 17, wherein $$\Delta n_1 = \frac{n_1 - n_2}{n_1}$$

is constant at $$5 \times 10^{-2} \text{ and } \Delta n_2 = \frac{n_1 - n_3}{n_1} \text{ and } \frac{n_1 b}{\lambda}$$

correlating the thickness of the optical wave guide b with the free space wavelength ($\lambda$) are used as the two parameters. The x-axis indicates $(n_1 a)/(\lambda)$ correlating the width of the optical move guide a with the free space wave-length ($\lambda$), and the y-axis indicates $(K_z^2 - K_2^2)/(K_1^2 - K_2^2)$. wherein K is the number of waves and $$K_1 = \frac{2n_1}{\lambda}, K_2 = \frac{2n_2}{\lambda}$$

and $K_z$ is the number of waves being propagated through the optical wave guide. If $(K_z^2 - K_2^2)/(K_1^2 - K_2^2)$ approaches zero, $K_z$ becomes equal to $K_2$, and this means that the light is propagated at the number of waves for the cladding and spreads in a wide area to cause great loss. If $(K_z^2 - K_2^2)/(K_1^2 - K_2^2)$ approaches 1, $K_z$ becomes equal to $K_1$, and this means that the light is substantially confined within the optical wave guide and the number of waves is determined only by the refractive index $n_1$. The closer to 1 the value of $(K_z^2 - K_2^2)/(K_1^2 - K_2^2)$ is, the better the optical wave guide characteristics.

In FIG. 18, the dispersion characteristics where $$n_2 = \frac{n_1 - n_3}{n_1}$$

is $10^{-3}$, $10^{-2}$ and $5 \times 10^{-2}$ are shown for each of the cases where $(n_1 b)/(\lambda)$ is 0.5, 1 and 1.5 on the condition that the propagation is in a fundamental mode (TE$_{oo}$, TM$_{oo}$). As the value of $(n_1 b)/\lambda$ is increased, the optical wave guide characteristics become better, but if the former becomes greater than 1.5, higher-ordermodes begin to be propagated and the threshold current of the laser is increased. To minimize the threshold current, d is usually selected at between 0.1 and 0.2 $\mu$m for a GaAs—GaIAs laser using a short resonator. This means good results are obtained if $(n_1 b)/(\lambda)$ is greater than 0.5 and less than 1. If $\Delta n_2$ is $10^{-3}$, the value of $(K_z^2 - K_2^2)/(K_1^2 - K_2^2)$ is substantially constant irrespective of the optical wave guide width a, and this means the light is not effectively confined in the transverse direction. As the value of $\Delta n_2$ increases to $10^{-2}$ or $5 \times 10^{-2}$, the optical wave guide characteristics become more-dependent on the optical wave guide width, and they are significantly impaired when $(n_1 b)/(\lambda)$ becomes less than 2 or 3. To know the exact limit on the reduction in the stripe width, a calculation is made to determine the confinement coefficient of the optical wave guide.

Figure 19:
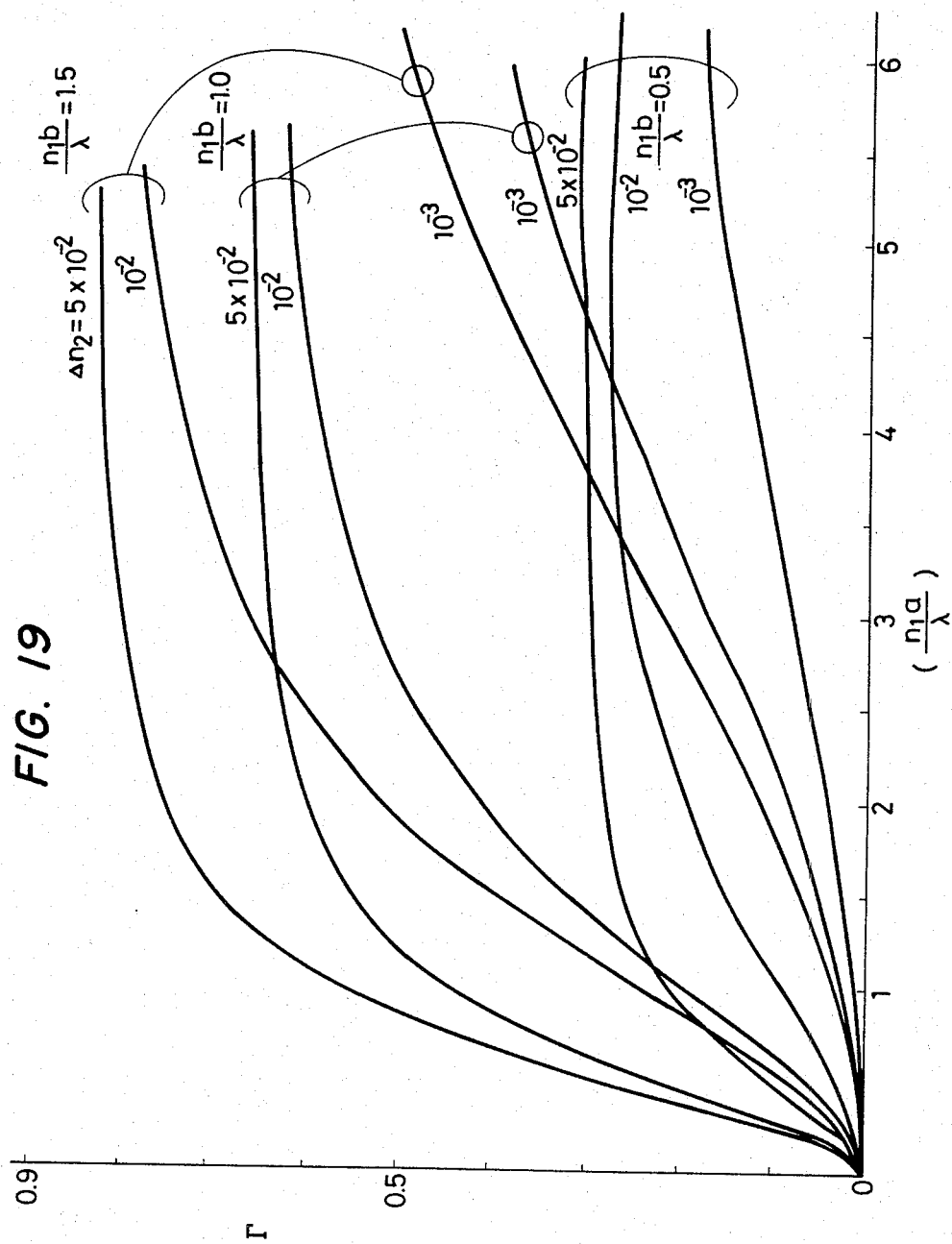
Figure 20A:
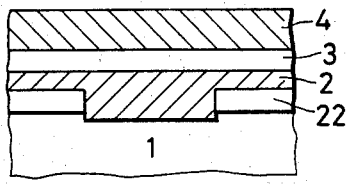
FIGS. 20a–20h show various cross sections of the light guiding portion that achieves mode stabilization.
Figure 20B:
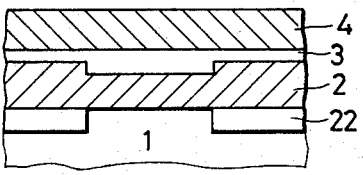
Figure 20C:
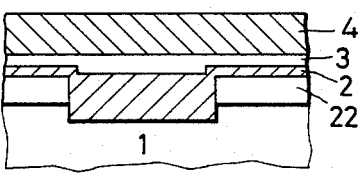
Figure 20D:
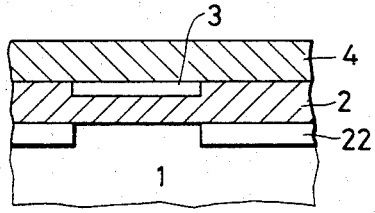
Figure 20E:
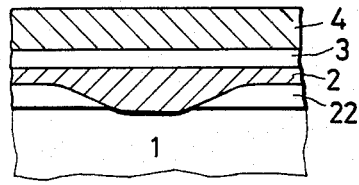
Figure 20F:
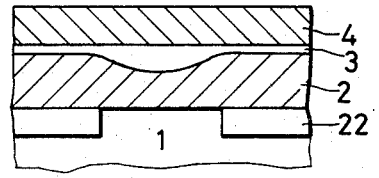
Figure 20G:
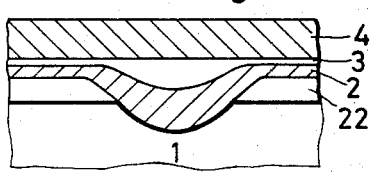
Figure 20H:
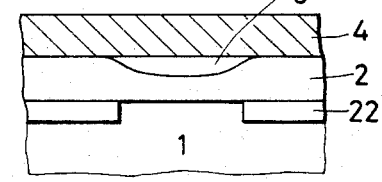

FIG. 19 shows the relation between the confinement coefficient ($\Gamma$) and $(n_1 a)/(\lambda)$ corresponding to the stripe width. The confinement coefficient $\Gamma$ indicates the intensity of light present within the area of the optical wave guide (a $\times$ b) as compared with the total intensity of light present in the total area of the device, and the closer to 1 the value of $\Gamma$ is, the more light is concentrated in the core or the active layer. If $n_2$ is $5 \times 10^{-2}$, $(n_1 a)/(\lambda)$ can be made smaller to be between 1 and 2, but if $n_2$ is $10^{-2}$, the limit on $(n_1 a)/(\lambda)$ is between 2 and 3, and if $n_2$ is $10^{-3}$, the confinement coefficient cannot be made greater even if $(n_1 a)/(\lambda)$ is between 5 and 6. The value of $\Delta n_2$ must be greater than a certain value to obtain good light propagation characteristics and lower the threshold current density. The effect of $\Gamma$ is apparent from formula (1), and if it is smaller than 1, the apparent internal loss and mirror loss are increased.

In a double heterojunction structure, satisfactory carrier confinement can be effected in the direction perpendicular to the heterojunction by making the band gap of the active layer somewhat smaller than that of the cladding, but this is not the usual case for the direction parallel to the heterojunction; the only exceptions being the buried heterojunction (BH) laser or the TJS laser. In other words, carriers can be confined in the direction parallel to the stripe width by forming a heterojunction structure in the transverse direction or by forming a potential barrier of opposite conductivity type.

The device of FIG. 14 has the following specifications: the anodic p+ GaAs substrate 1 has an impurity density of $1 \times 10^{18}$ to $2 \times 10^{19}$ cm$^{-3}$; the substrate has a recess 21 which is typically 1 to 1.5 $\mu$m deep; the p-Ga$_{1-x}$Al$_x$As layer 2 (x is up to 0.3 and p is up to $1 \times 10^{17}$ cm$^{-3}$) is formed on the substrate to fill the recess; the n-GaAs layer 22 whose conductivity type is opposite that of the substrate 1 and layer 2 has a thickness of 0.1 to 1.5 $\mu$m and an impurity density of $1 \times 10^{16}$ to $1 \times 10^{18}$ cm$^{-3}$; the GaAs active layer 3 has a thickness of 0.05 to 1 $\mu$m and an impurity density of $1 \times 10^{14}$ to $1 \times 10^{17}$ cm$^{-3}$; the n-Ga$_{1-x}$Al$_x$As layer 4 (x is typically 0.3) has a thickness of 0.5 to 3 $\mu$m and an impurity density of $1 \times 10^{13}$ to $1 \times 10^{16}$ cm$^{-3}$; the n-GaAs layer 5 has a thickness of 0.5 to 2 $\mu$m and an impurity density of $1 \times 10^{13}$ to $1 \times 10^{16}$ cm$^{-3}$; the p+ gate region 6 has an impurity density of $1 \times 10^{18}$ to $5 \times 10^{19}$ cm$^{-3}$; the n+ cathode region 10 has an impurity density of $1 \times 10^{18}$ to $5 \times 10^{19}$ cm$^{-3}$; and the intergate gap (channel width) is about 0.3 to 3 $\mu$m. Even if the layers 1, 2 and 6 are n-type and the other layers p-type (the active layer may be of whichever type), the regions 1, 6 and 10 will be called the anode, gate and cathode, respectively. The n+ cathode region 10 may extend into the GaAlAs layer 4.

The device of FIG. 14 can be fabricated by the following procedure: n-type ions such as Te, S, Se and Si ions are implanted into the surface of the p+ substrate to a concentration of about $1 \times 10^{16}$ to $1 \times 10^{18}$ cm$^{-3}$; the substrate is annealed in an AsH$_3$ atmosphere at about 1 to 3 Torr and at 800°–900° C.; a striped groove is etched in the substrate and layers 2, 3, 4 and 5 are formed successively by the epitaxial growth technique; and a high-impurity area is formed in regions 6 and 7 by diffusion or ion implantation. If ion implantation is employed to make a p+ region, ions such as Be and Cd are used, and if the diffusion method is employed, an impurity such as Zn is used.

Various structures can be employed to provide an optical wave guide and the structure shown in FIG. 14 is not the only example. What is necessary is to surround the light propagating area with an area having a refractive index substantially lower than that of the propagating area. Two basic structures to provide this arrangement are a stepped structure wherein the refractive index changes stepwise and the light travels as it reflects on the interface of the two refractive indices, and a self-focussing (graded index) structure wherein the refractive index is the highest at the center of the light-guide as in a convex lens and it decreases from the center outward to cause the light to travel along a serpentine path. The groove 21 in FIG. 14 provides a stepped structure. Various forms of the optical wave guide area and current focusing area that can be used in the present invention are shown in FIG. 20, wherein (a) to (d) represent the stepped structures and (e) to (h), the self-focusing structures. Other forms, say, trapezoidal, triangular and even polygonal may be used as the optical wave guide if it has a refractive index high enough to provide a light focusing area and current concentrating area.

In FIG. 14, the gate region 6 extends from the layer 5 into layer 4. Since the two layers form a heterojunction and the layer 4 has a wider band gap than the layer 5, fewer holes are injected through the p-n junction in the gate region of layer 4 then through the p-n junction in the layer 5, and this is detrimental to the current gain. ($g_m = \Delta I_D / \Delta I_G$). It is therefore desired that the p gate region in the layer 5 be separated from the n+ cathode region by an insulator.

Figure 21:
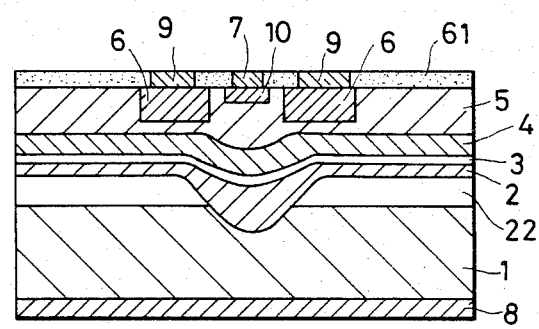
FIGS. 21 to 25 are cross sections of semiconductor lasers capable of mode stabilization.
Figure 22:
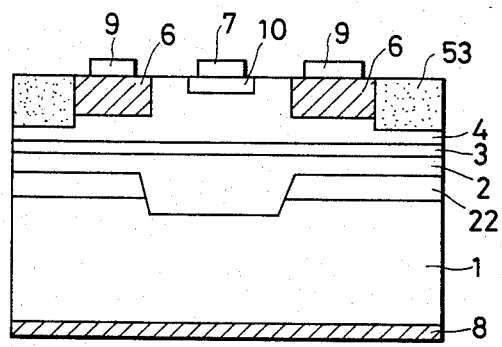

FIG. 21 shows an embodiment wherein the current gain is increased by forming the gate region 6 within the layer 5 thicker than the layer 4. The layer 5 is not essential to the laser mechanism since it usually has no effect on the threshold current and is used solely to reduce the resistance due to ohmic contact of the electrodes 7 and 9. FIG. 22 shows an embodiment wherein the layer 5 is eliminated and the gate region is buried in a thicker layer 4. A GaAs-GaAlAs double heterojunction semiconductor laser uses the layer 5 to reduce the ohmic resistance, but an InP-InGaPAs double heterojunction laser generally employs the structure of FIG. 22 which typically comprises a p+ InP substrate 1, n+ InGaAsP layer 22, p+ InP layer 2, InGaPAs active layer 3, n-InP layer 4 and p+ InP region 6. Because of the presence of the $In_{1-x}Ga_xP_yAs_{1-y}$ active layer, various compositions can be realized in the device of FIG. 22 by effecting lattice matching with the crystal lattice of the InP, and the characteristic wavelength ($\lambda$) for light emission can be adjusted between about 1.0 and 1.7 μm depending on the specific composition. But if $\lambda$ is 1.4 μm or more, it is sometimes necessary to form a buffer layer between the active layer 3 and cladding 4 to minimize the effect of meltback during liquid-phase growth of the InGaPAs layer. As in the other embodiments, the device of FIG. 22 has a high-resistivity region 53 which is formed by, say, proton irradiation, which is effective in inhibiting the carrier injection into an undesired area so as to increase the current gain, and at the same time, it aids in decreasing the capacitance of the gate-region, and hence the modulation frequency. If the semiconductor has a very narrow bandgap, a high-resistivity region cannot be made by proton irradiation, but in this case, the same object can be attained by forming an insulator of $Si_3N_4$, $SiO_2$, AlN or $Al_2O_3$.

Figure 23:
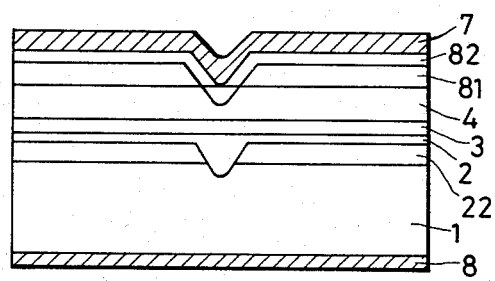
Figure 24:
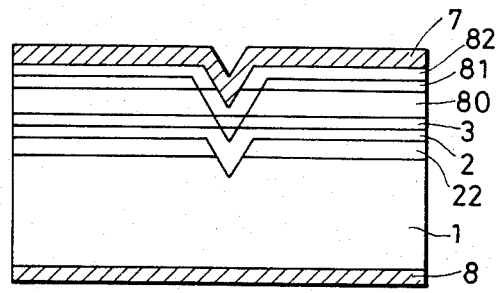

The structure of providing an effective refractive index distribution in the direction parallel to the p-n junction and achieving current focusing is applicable to not only a three-terminal semiconductor laser but also an ordinary two-terminal semiconductor laser. FIGS. 23 and 24 show embodiments of a two-terminal semiconductor laser. As already mentioned, the structure of the present invention is effective for providing a narrow stripe, and particularly good results are obtained when the stripe width (W) is less than 5 μ. If W is equal to or less than 2 or 3 μm, the conventional semiconductor laser experiences significant mode instability and an increase in the aparent threshold current density, but these problems are satisfactorily solved by the present invention.

The device of FIG. 23 includes a region 81 which is typically a n-type GaAs layer, and 82 is a p+ region formed by diffusion or ion implantation. Because of a reverse bias, no current flows along the interface of the layers 81 and 82, and instead, current flows only in the interface between layer 82 and layer 4. Therefore, the V groove in the layer 82 is most effective in the simple formation of a narrow stripe. In the device of FIG. 24, the region 80 is also of n-type such as by using GaAlAs, and a deep V groove is made in the region 82 so that it extends even to the layer 2 through the active layer 3. Then, because of the hetero-junction, the current flowing area is localized in the junction of the region 82 and layer 3, and this again is very effective in forming a narrow stripe.

Figure 25:
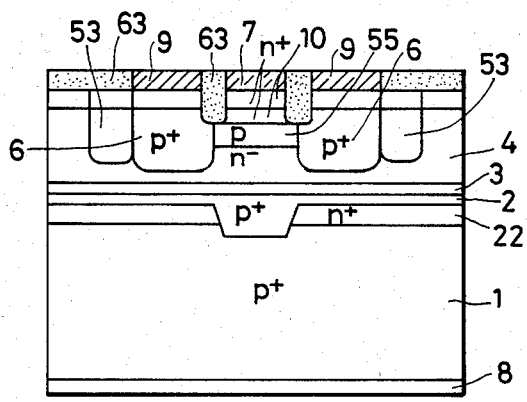

FIG. 25 shows an embodiment wherein a p-region is formed in the channel region, the other parts of the device being essentially the same as described in the foregoing and identified by like numerals.

Figure 26:
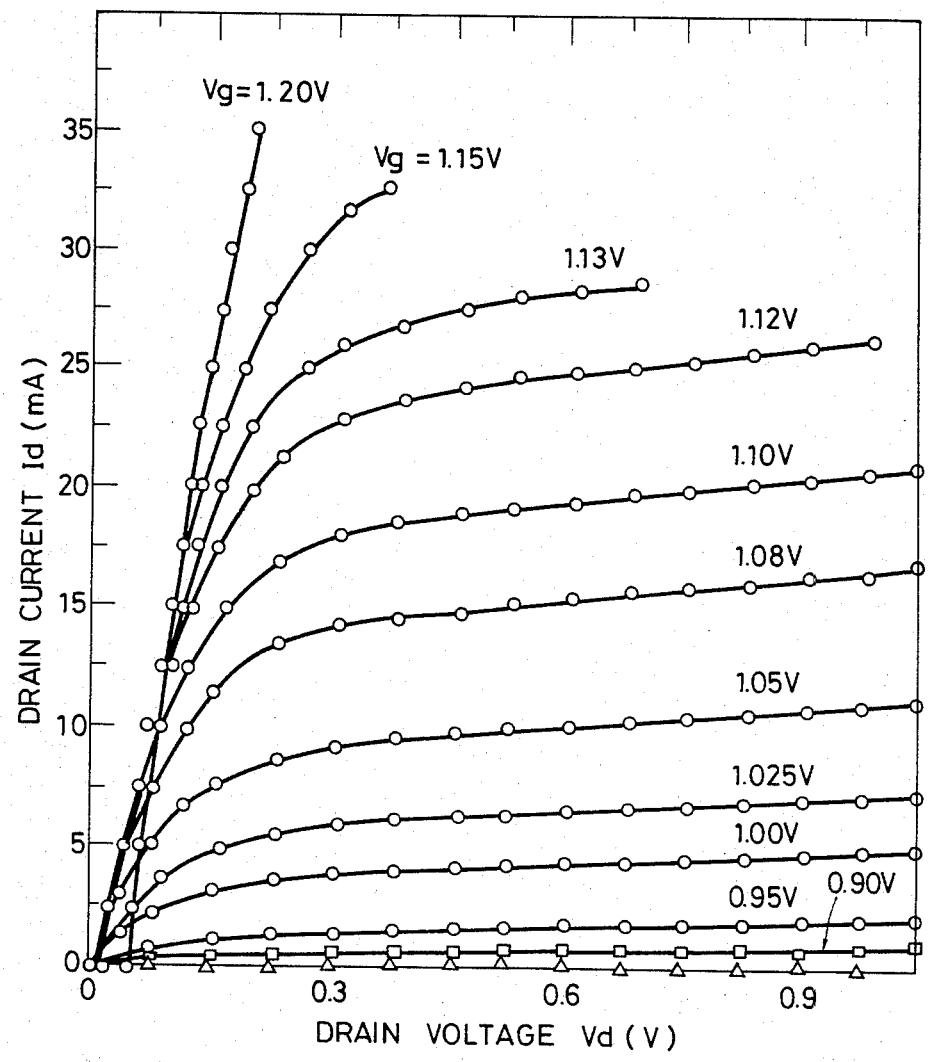
FIG. 26 is a current vs. voltage characteristic diagram for a bipolar mode static induction transistor mode of GaAs.

FIG. 26 shows current vs. voltage characteristic curves of a BSIT GaAs. The device has the following specifications: the intergate gap is 1.5 μm; the depth of the p+ gate is 2 μm; the distance between the n+ source region and n+ drain region is 2.5 μm; the length of the channel stripe is 200 μm; and the impurity density of the channel is $5 \times 10^{13}$ cm$^{-3}$. The drain current is plotted on the y-axis and the drain voltage is plotted on the x-axis. The symbol Vg indicates the gate voltage. According to FIG. 26, as the gate voltage is increased in the forward direction, more current flows. The BSIT has a channel that is made of a region having a very low impurity density, but—since carriers are directly injected into the channel from the source region, electrons of a density of $1 \times 10^{17}$ cm$^{-3}$ or more are easily injected into the channel. Furthermore, the electron mobility is as high as 8000 to 9000 cm/Vsec, so it is quite easy to achieve a current density of $1 \times 10^4$ A/m$^2$.

Figure 27:
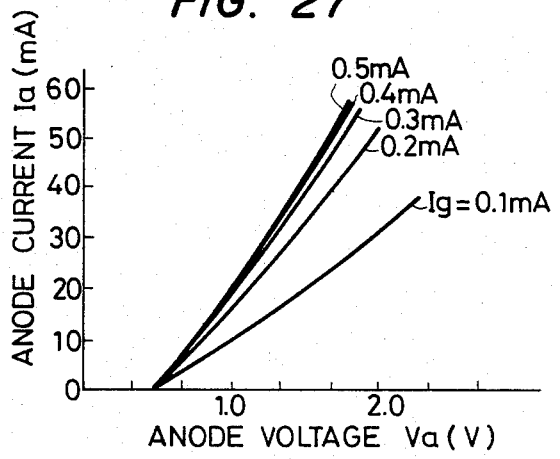
FIG. 27 is a current vs. voltage characteristic diagram for an electrostatic induction semiconductor-laser.

FIG. 27 shows current vs. voltage characteristic curves of the device shown in FIG. 1. The anode current is plotted on the y-axis and the anode voltage on the x-axis. The symbol Ig indicates the gate current when the gate is forward-biased. Obviously, the characteristics of the device in the conducting state differ from those shown in FIG. 26. The device of FIG. 1 is a GaAs-Ga$_{0.7}$Al$_{0.3}$As laser and whose specifications are the same as those of the device used to obtain the data of FIG. 26. Its active layer has a thickness of about 0.5

μm and laser oscillation takes place at a threshold current of 20 to 30 mA.

The foregoing embodiments concern a static induction thyristor type semiconductor laser formed integrally with a single-channel BSIT, but the present invention can also be applied to a multi-channel semiconductor laser without difficulty.

Figure 28:
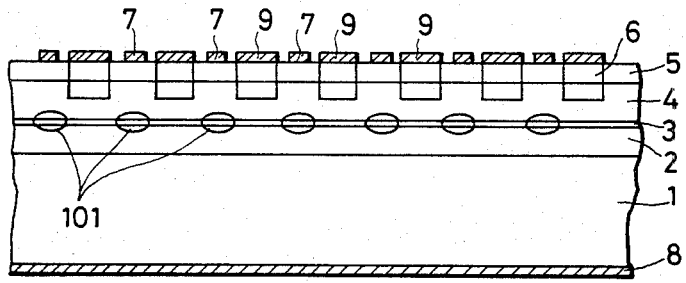
FIGS. 28 and 29 are cross sections of two static induction semiconductor lasers having a multi-channel.
Figure 29:
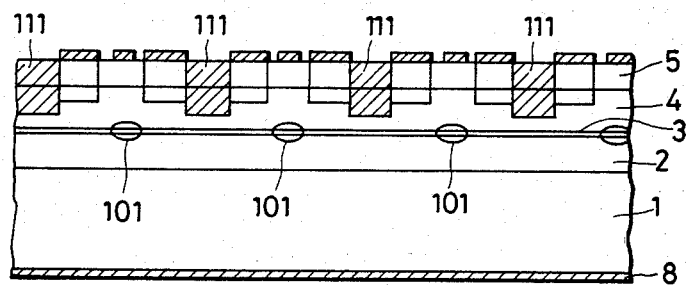

FIG. 28 is a cross section of a multi-channel semiconductor laser taken in the direction normal to the laser resonator. In a simple multi-channel laser, the laser light waves emitted from regions 101 have entirely-different phases. But if a GaAlAs-GaAs laser is so fabricated that the thickness of the layer 4, the stripe width and the center-to-center distance of two stripes are 2 μm, 3 μm, and 10 μm, respectively, the individual stripes are partially coupled to each other and the regions 101 emit coherent laser light having synchronized spots. Coherent spots provide a sharper emission directivity than a single spot. The interval of the light emitting regions 101 depends on the carrier diffusion length and the distance travelled by leaking laser light, so it varies with the material and structure used. When every light-emitting region 101 emits coherent light, a high-power light source for semiconductor lasers can be realized. When the individual light-emitting regions 101 need to be controlled independently of each other by the gate voltage, a high-resistivity region or an insulation region 111 may be formed between adjacent gates so that each region 101 can be controlled independently of the others by means of the gate voltage applied to each region. Alternatively, the regions 101 may be made discrete by etching the region 111. But the problem will remain in connection with the interval of each light-emitting region 101. When this interval is very small, the regions 101 interact and cannot be operated independently of each other. The specifications of a typical multi-channel $Ga_{0.7}Al_{0.3}As$-GaAs laser adapted for independent operation of the light-emitting regions 101 are as follows: the thickness of layer 2 is 2 μm; the thickness of layer 3 is 0.1 to 0.3 μm; the thickness of the layer 4 is 2 μm; the stripe width is 3 μm; and the stripe interval is 20 μm. A plurality of static induction thyristor semiconductor lasers formed on one substance as shown in FIG. 29 can be used in an optical communication system for achieving simultaneous transmission of information over multi-channels. In other words, high-speed and high-volume information processing can be realized. A device comprising a plurality of lasers wherein the individual light-emitting regions are spaced at an interval of less than 10 μm can be used as a laser-radar for electrical scanning by successively switching the lasers to change the directivity of the laser light. The optical directivity and output can also be controlled by independently operating every other laser, i.e., next nearest neighbor lasers in an array having an interstripe gap of about 10 μm or by applying a current through all lasers to emit coherent light. It is to be understood that the structure of providing an effective refractive index distribution in the direction parallel to the p-n junction and achieving current focusing described by reference to FIG. 5.— FIG. 25 can also be applied to the multi-channel semiconductor laser of FIGS. 28 and 29. It is also to be understood that the laser of FIGS. 28 and 29 can be made of materials other than GaAs-GaAlAs and InP-InGaPAs.

Figure 30A:
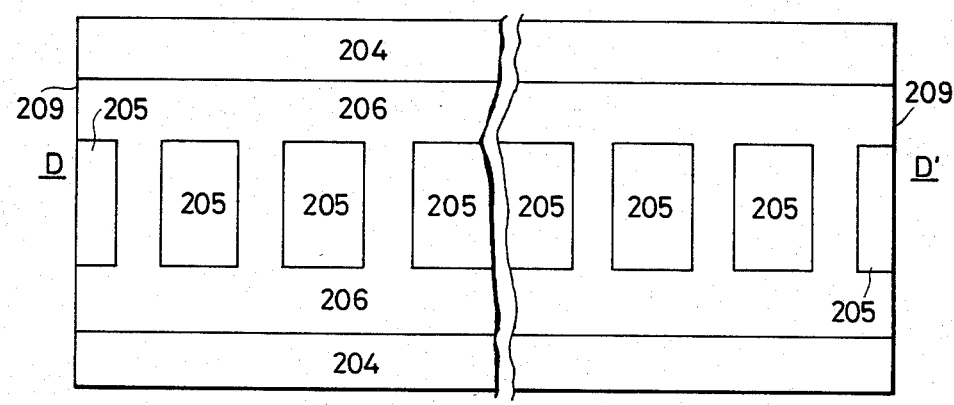
FIGS. 30a, 30b and 31a–31c are plan and sectional views of two static induction semiconductor lasers having an axial mode stabilizing structure.
Figure 30B:
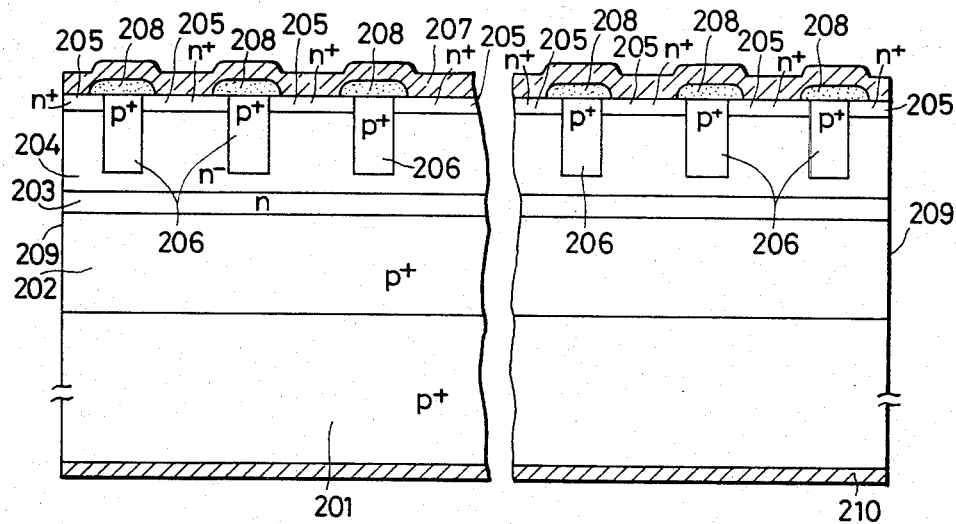

Another modification of the static indication thyristor type semiconductor laser of the present invention is shown in FIG. 30. This embodiment produces a great optical output at a single wavelength. FIG. 30(a) is a plan view of the device and FIG. 30(b) is a cross section of FIG. 30(a) taken along the line D—D'. The device, which is typically made of InP-InGaAsP, comprises a p+ InP substrate 201, p+ Inp grown layer 202, n-InGaAsP active layer 203, n InP grown layer 204, n+ cathode region 205, p+ gate region 206, a cathode electrode 207, an insulator layer 208 made of $Si_3N_4$, $SiO_2$ or AlN, a mirror surface 209, and an anode electrode 210. The period of p+ gate 206 in the direction of laser emission is set at mλ/2n (λ: radiation wavelength, n: approximately the refractive index of the active layer, m: integer), and if λ=1.5 μm and n=3.3 μm=1, the period of the gate is about 0.23 μm. If the length of the gate in the direction of laser emission is 0.13 μm, the intergate gap is 0.1 μm. The impurity density of the n⁻ region 204 and the depth of the p+-gate (channel length) are the same as specified in the foregoing embodiments. Since the intergate gap is relatively small, the device has satisfactory normally-off characteristics even if the impurity of the n⁻ region is as high as $1 \times 10^{15}$ cm⁻³. A satisfactory normally-off device is also provided if the channel length is at least 0.1 or 0.2 μm. In the semiconductor laser of FIG. 30, current flows periodically only in the proximity of the area where the intensity of the electric field of the axial standing wave of laser emission is at maximum. So the laser easily oscillates in a single axial mode, and this is so even if the actual current flowing is significantly greater than the threshold level. The semiconductor laser of FIG. 30 is designed so that the standing wave of laser emission is in synchronism with the gain distribution, and it is capable of operating to produce a very large output in a single exial mode. Operation at a completely single wavelength and frequency is realized by using single transverse and vertical modes. A single transverse mode can be achieved by restricting the length of a stripe width limited surrounded by the p+ gate region 206 to a few microns, and a single vertical mode can be obtained by restricting the thickness of the active layer to be less than 0.5 μm. The exact values of these parameters vary with the difference in refractive index between the active layer and the surrounding layer. It is also effective to shorten the length of the resonator in attaining a single axial mode. A semiconductor laser that operates in a completely single mode for axial, vertical and transverse directions maintains operation at a single wavelength even if subjected to direct modulation of the current being injected into the laser, so it can be used for communications with high system stability.

If the intergate gap in the direction of the laser resonator in FIGS. 30a and 30b is decreased, the current flows only in the proximity of the area where the intensity of the electric field of the standing wave of the laser light is at maximum, and this contributes greatly to the achievement of a single axial mode. One reason causing oscillation in more than one axial mode is that carriers injected into the active layer diffuse in the transverse direction. Therefore, to inhibit such diffusion, the active layer is desirably as thin as possible. More preferably, the active layer is thinner than the period of the standing wave of the laser light (λ/2n). For a semiconductor laser capable of oscillation in a single axial mode, the active layer and the surrounding layer preferably have a sufficiently great difference in refractive index to confine the laser light to the active layer even if it is relatively thin.

Needless to say, the spreading of carriers in the transverse direction can be effectively inhibited by forming a p+ region 206 which is deep enough to extend to a point just short of contacting the active layer 203. To increase the current gain, the region 204 on either side of the p+ gate region 206 may be converted to a semi-insulating region by proton irradiation. Alternatively, the same area may be etched away and replaced by an insulation layer.

Figure 31A:
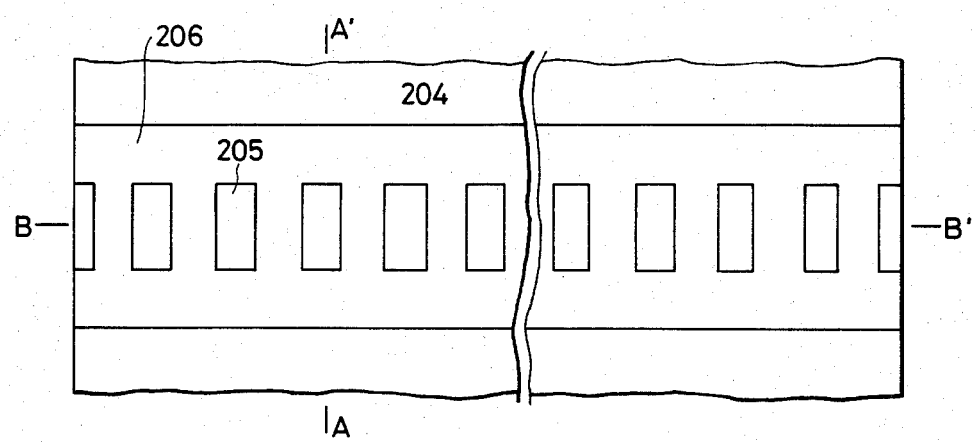
Figure 31B:
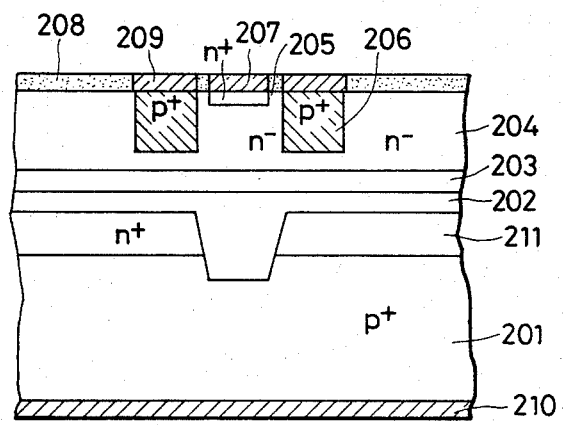
Figure 31C:
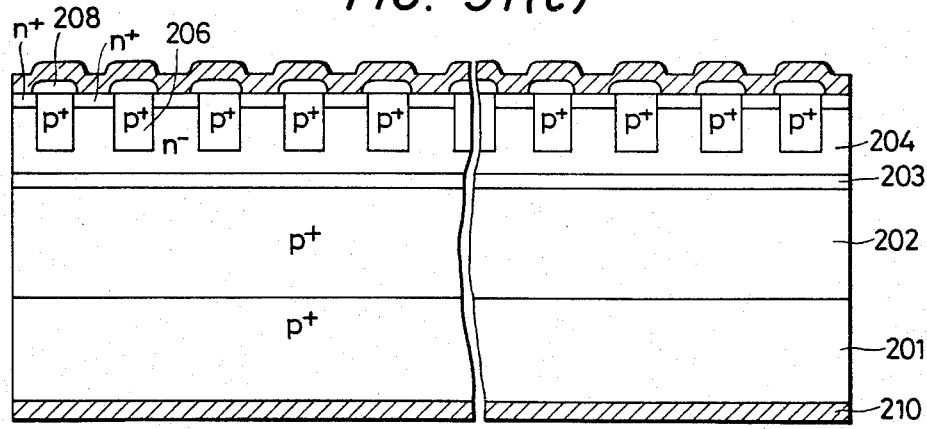

The devices shown in FIGS. 28 to 30a and 30b have a narrow stripe geometry but they are not designed to be capable of stable oscillation in a transverse mode. FIGS. 31a, b and c is an embodiment having a structure capable of effecting stable oscillation in both transverse and axial modes. FIG. 31(a) is a plan view of the device, FIG. 31(b) is a cross section of FIG. 31(a) taken along the line A—A', and FIG. 31(c) is a cross section of FIG. 31(a) taken along the line B—B'. Assuming an InP-InGaAsP construction, the device comprises a p+ InP substrate 201, a p+-InP grown layer 202, an InGaPAs active layer 203, an n−-Inp layer 204, an n+-Inp region 205, a p+-Inp region 206, a cathode electrode 207, a gate electrode 209, an anode electrode 210, an insulator layer 208 made of $Si_3N_4$, $Al_2O_3$, AlN or $SiO_2$, and an N+ InGaPAs layer 211. The period of the p+ gate in the direction of laser emission is set to $m \cdot (\lambda/2n)$ ($\lambda$: free space wavelength, n: the refractive index of the active layer, m: an integer value 1, 2 . . . ). The greater than 1 the value of m is, the lower the efficiency in mode selection. For example, if $\lambda = 1.5$ $\mu$m, $n = 3.3$ and $m = 1$, the period is 0.23 $\mu$m, and if $m = 3$, the period is 0.69 $\mu$m. In the semiconductor laser of FIGS. 31a, b and c, current flows periodically only in the proximity of the area where the intensity of the electric field of the axial standing wave of laser emission is at maximum. Thus the laser easily oscillates in a single axial mode, and this is so even if the actual current flowing is significantly greater than the threshold level. The structure of FIG. 31 is also applicable to a DFB (distributed feedback) DH semiconductor laser. A semiconductor laser that operates in a completely single mode for axial, vertical and transverse directions keeps operating on a single wavelength even if it is subjected to direct modulation of the current being injected into the laser, so it can be used for communication with high system stability.

Figure 32:
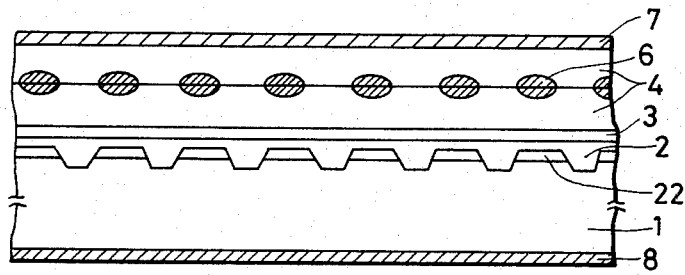
FIGS. 32 to 34 are cross sectional views of three electrostatic induction semiconductor lasers having a multi-channel and a transverse mode stabilizing structure.
Figure 33:
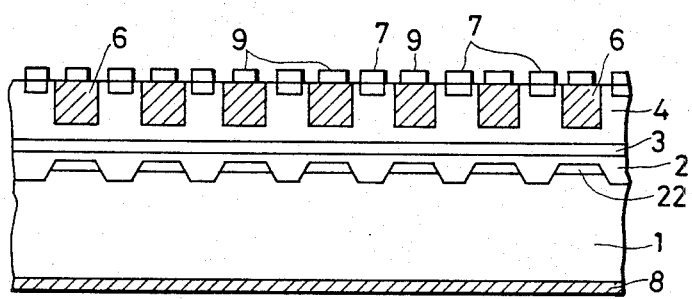
Figure 34:
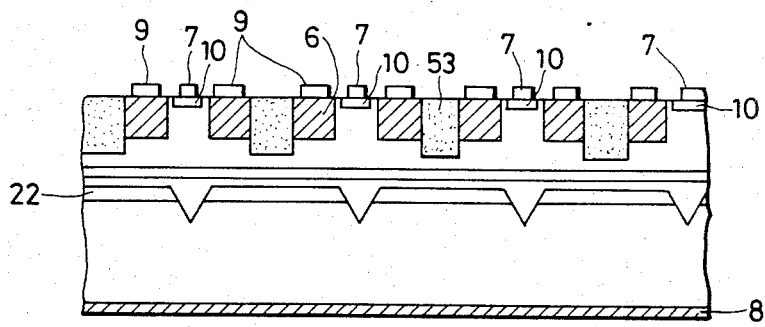

A multi-channel semiconductor laser capable of stable oscillation in a transverse mode can also be fabricated according to the present invention. Three embodiments of this type of laser are shown in FIGS. 32, 33 and 34 in cross sections cut perpendicularly to the direction of the laser resonator. The device shown in FIG. 32 is a three-terminal multi-channel semiconductor laser wherein the gate region 6 is buried in the semiconductor region 4; the device of FIG. 33 is a surface gate type multi-channel three-terminal semiconductor laser fabricated by surface diffusion or ion implantation; and the device of FIG. 32 has potential use as a high-power semiconductor laser which emits laser light from all spots simultaneously. If the gate is of the buried type as shown in FIG. 32, more gate current is necessary to cause the same current to flow between the cathode and anode, and this results in low current gain. The semiconductor laser of FIG. 34 is so designed that light can be emitted from all pots or selectively controlled spots. If all light-emitting regions are switched on at the same time, the coherence of the light is also an important factor. When the device of FIG. 34 is a GaAlAs-GaAs laser and when the thickness of the layer 4 is 3 $\mu$m, the cathode stripe width is 3 $\mu$m, the diffusion depth is 2 $\mu$m and the center-to-center distance of two stripes is less than 10 $\mu$m, the individual light-emitting spots can produce coherent laser lights by using a waveguide coupling structure. The distance between each light-emitting region depends on the carrier diffusion length in the transverse direction, the distance travelled by leaking laser light and the specific structure of the waveguide coupling, and hence on the specific material and structure used. If the individual light-emitting regions must be controlled independently of each other, a high-resistivity region 53 may be formed between adjacent gates by proton or helium irradiation, or instead an insulating region may be formed in that area. This enables independent control of the respective light-emitting regions by changing the gate voltage. Alternatively, the light-emitting regions may be made discrete by etching the region 53. Of course, a layer of $Si_3N_4$ or AlN may be deposited on the etched area by photo-excited CVD. The interval between each light-emitting region should not be too small. The gate may have other structures, for example, it may be notched or grooved.

Figure 35A:
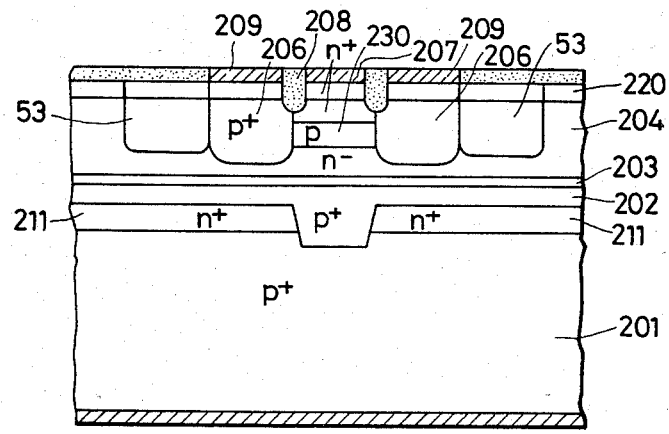

FIGS. 35a and 35b shows an embodiment capable of stable oscillation in both transverse and axial modes and which also has a p-region in the channel. The device includes a GaAs layer 220, and a cathode n+ region 205 that extends down to a GaAlAs layer, and a p-region formed in the channel region beneath said GaAlAs layer. A p-channel may be formed in other parts of the device as in the previous embodiments of the invention.

Figure 36:
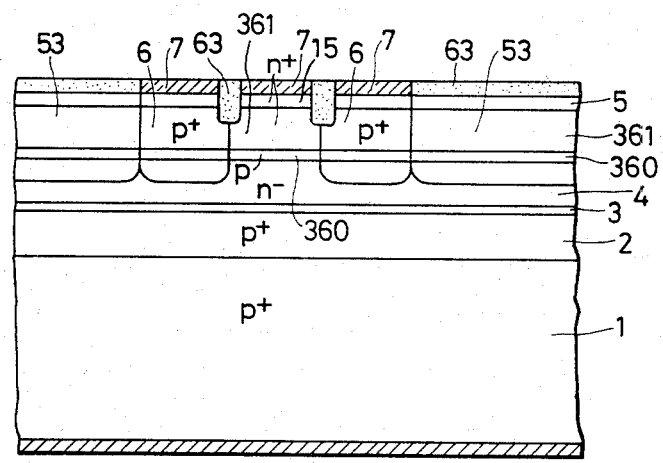
FIG. 36 shows another embodiment having a p-region in the channel.

FIG. 36 shows another embodiment of the device having a p-region in the channel. The device includes a p-type layer 360 that is made of a material having a smaller band gap than layers 4 and 361. If the device is a GaAs-GaAlAs semiconductor laser, the layer 360 is made of GaAs or $Ga_{1-y}Al_yAs$, the layer is made of n− $Ga_{1-x}Al_xAs$ and the layer 361 is made of $Ga_{1-x}Al_xAl$ ($x > y$). This structure is effective in increasing the current gain because positive holes injected from the gate are blocked by the barrier of the heterojunction and are unable to enter the cathode. The turn off time is determined by the rate of drawing electrons and holes from the channel, and the device of FIG. 36 has a very fast response time since the p-region is made of a direct transitional material and the carrier lifetime is very short. In other words, the performance of the device can be significantly improved by making the p-region with a material that has a smaller band gap then the material used in the other regions and which is a direct semiconductor material. It is to be understood that the structure of FIG. 36 can be applied to the other embodiments which include a p-region in the channel. It is also to be understood that various modifications can be made to the semiconductor laser of the present invention without being limited to the foregoing embodiments. The devices shown in the embodiments use a p+ substrate, but they may use an n+ substrate and other semiconductor regions whose conductivity type is opposite that used in the embodiments. The light-emitting regions that can be used in the present invention are not limited to those described in the embodiments, and a buried heterojunction (BH) structure, a plano-convex waveguide (PCW) structure and a buried crescent (BC) structure can also be used. The usable semiconductor materials are also not limited to GaAs-GaAlAs and InP-InGaPAs; other compound semiconductors of groups III–V, II–VI and IV–VI, as well as heterojunction structure made of mixed crystals of these materials may be used. Needless to say, these semiconductor materials have different refractive indices and carrier diffusion lengths and require various design changes in fabricating optimum devices.

As described in the foregoing, the present invention provides an static induction three-terminal semiconductor laser whose optical output can be easily controlled by means of the gate voltage and which is capable of highspeed modulation. The device can be adapted to a multichannel structure which finds expanded utility. The device can also be subjected to direct modulation while producing an optical output at a single wavelength and frequency, so it can be used most effectively in a communication system. The light-guiding portion (the inside of the stripe width) of the device can be provided with a substantially different optical gain and loss and refractive index than the surrounding area, and at the same time, the transverse spreading of current can be minimized by providing the substrate with an area of opposite conductivity type or a high-resistivity area, and by so doing, a semiconductor laser with a narrow stripe that is capable of stable oscillation in both transverse and axial modes can be produced. In short, a gate region having a high impurity density is used to confine the operating current between gate regions, and this is equivalent to a waveguide structure provided in a direction parallel to the junction surface in the active region where actual emission of the laser is effected. The intergate gap may be substantially equal to or a little smaller than the width of the light guide area. By so doing, the current flows only in the area having a high intensity of laser light and the device has a very high lasing efficiency. The channel length can be shortened and better normally-off characteristics can be obtained by forming a thin p-layer of a relatively low impurity density between the n+ cathode region and the active layer. The device of the present invention can also be provided with a plurality of gates at a given interval in the direction of laser guided wave, and such device is capable of stable oscillation at a single wavelength in a single mode for both transverse and vertical directions over a wide range of operating currents, and at the same time, it radiates stable wavelengths during optical modulation. The use of the device is further expanded by incorporating a multi-channel structure. Therefore, the present invention presents a semiconductor laser that finds much utility in industry.

What is claimed is:

1. A three terminal heterojunction semiconductor laser formed in a semiconductor body having first and second opposing principal surfaces comprising a highly doped anode region of a first conductivity type disposed in said body adjacent to said second principal surface;
   an active region where laser oscillation takes place adjacent said anode region;
   a highly doped cathode region of a second conductivity type opposite to said first conductivity type disposed in said body adjacent to said first principal surface;
   a channel region of said second conductivity type made of a high-resistivity region and formed between said active region and said cathode region;
   a highly doped gate region of said first conductivity type surrounding at least a part of said channel region;
   at least a part of said anode region and channel region having a wider band gap and a lower refractive index then those of said active region in which light and carriers are confined;
   electrodes formed on at least said anode, cathode and gate regions; and
   an optical resonator for the laser oscillation wherein a potential barrier at zero gate bias voltage is formed in said channel region by designing the predetermined carrier concentration and dimension of said channel region and the injected carriers into said active region are controlled by said potential barrier controlled according to a gate voltage.

2. A three terminal heterojunction semiconductor laser formed in a semiconductor body having first and second opposing principal surfaces comprising a highly doped anode region of a first conductivity type disposed in the substrate side of said body adjacent to said second principal surface;
   an active region where laser oscillation takes place adjacent said anode region;
   a highly doped cathode region of a second conductivity type opposite to said first conductivity type disposed in said body adjacent to said first principal surface;
   a channel region of said second conductivity type made of a high-resistivity region and formed between said active region and said cathode region;
   a highly doped gate region of said first conductivity type surrounding at least part of said channel region;
   at least a part of said anode region and channel region having a wider band gap and a lower refractive index than those of said active region in which light and carriers are confined;
   electrodes formed on at least said anode, cathode and gate regions; and
   an optical resonator for the laser oscillation;
   said laser further including in a direction parallel to the heterojunction and said optical resonator, a structure for increasing the effective refractive index and effective gain in a laser light-emitting region, a region of said second conductivity type for concentrating current between said anode region and said active region being formed around the laser light-emitting region, wherein a potential barrier at zero gate bias voltage is formed in said channel region by designing the predetermined carrier concentration and dimension of said channel region and the injected carriers into said active region are controlled by said potential barrier controlled according to a gate voltage.

3. A semiconductor laser according to claim 2, wherein an intergate gap is substantially equal to the width of said current concentrating region of said conductivity type.

4. A semiconductor laser according to claims 1 or 2, wherein said gate region is a buried region.

5. A semiconductor laser according to claims 1 or 2, further comprising an insulation region formed between each gate region and cathode region.

6. A semiconductor laser according to claims 1 or 2, including a thin layer of the first conductivity type between said cathode region and said active region.

7. A semiconductor laser according to claims 1 or 2, wherein said channel region includes a region of the first conductivity type.

8. A semiconductor laser according to claim 2, including means for focusing the current path on the substrate side comprising a layer of higher refractive index than said surrounding area.

9. A semiconductor laser according to claim 2, said structure comprising a stepped configuration wherein an effective refractive index varies stepwise.

10. A semiconductor laser according to claim 2, wherein said structure comprises a self-focusing configuration having a highest refractive index at the center thereof.

11. A semiconductor laser according to claim 2, a channel stripe region being formed by a V groove in at least an overlying layer of the substrate.

12. A semiconductor laser according to claim 1 further comprising an insulation region formed on outside of said gate region.

13. A semiconductor laser according to claim 2, further comprising an insulation region formed on outside of said gate region.

14. A semiconductor laser according to claim 6, further comprising an insulation region formed on outside of said gate region.

15. A semiconductor laser according to claim 1, wherein a plurality of said gate regions are formed at a given interval in the axial direction of laser emission.

16. A semiconductor laser according to claim 2, wherein a plurality of said gate regions are formed at a given interval in the axial direction of laser emission.

17. A semiconductor laser according to claim 6, wherein a plurality of said gate regions are formed at a given interval in the axial direction of laser emission.

18. A semiconductor laser according to claim 1, wherein a plurality of said gate regions are formed in a direction perpendicular to the direction of laser emission to provide a multi-channel structure having two or more laser light-emitting spots.

19. A semiconductor laser according to claim 2, wherein a plurality of said gate regions are formed in a direction perpendicular to the direction of laser emission to provide a multi-channel structure having two or more laser light-emitting spots.

20. A semiconductor laser according to claim 6, wherein a plurality of said gate regions are formed in a direction perpendicular to the direction of laser emission to provide a multi-channel structure having two or more laser light-emitting spots.

21. A semiconductor laser according to claim 18, further comprising insulation regions formed on every other gate space, that is, said cathode regions and said insulation regions formed alternatively on gate spaces.

22. A semiconductor laser according to claim 19, further comprising insulation regions formed on every other gate space, that is, said cathode regions and said insulation regions formed alternatively on gate spaces.

23. A semiconductor laser according to claim 20, further comprising insulation regions formed on every other gate space, that is, said cathode regions and said insulation regions formed alternatively on gate spaces.

* * * * *